(12) United States Patent
Tsai et al.

(10) Patent No.: US 12,412,841 B2
(45) Date of Patent: Sep. 9, 2025

(54) SEMICONDUCTOR PACKAGE AND MANUFACTURING METHOD THEREOF

(71) Applicant: Taiwan Semiconductor Manufacturing Company, Ltd., Hsinchu (TW)

(72) Inventors: Chen-Hsuan Tsai, Taitung (TW); Chin-Chuan Chang, Hsinchu County (TW); Szu-Wei Lu, Hsinchu (TW); Tsung-Fu Tsai, Changhua County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 56 days.

(21) Appl. No.: 18/523,895

(22) Filed: Nov. 30, 2023

(65) Prior Publication Data
US 2024/0105629 A1    Mar. 28, 2024

Related U.S. Application Data

(63) Continuation of application No. 16/805,856, filed on Mar. 2, 2020, now Pat. No. 11,854,984.
(Continued)

(51) Int. Cl.
*H01L 23/538*    (2006.01)
*H01L 21/48*    (2006.01)
(Continued)

(52) U.S. Cl.
CPC ...... *H01L 23/5383* (2013.01); *H01L 21/4857* (2013.01); *H01L 21/486* (2013.01); *H01L 21/565* (2013.01); *H01L 23/3121* (2013.01); *H01L 23/49822* (2013.01); *H01L 23/5226* (2013.01); *H01L 24/05* (2013.01); *H01L 25/0655* (2013.01); *H01L 25/50* (2013.01); *H01L 2224/02372* (2013.01)

(58) Field of Classification Search
CPC ............ H01L 25/0655; H01L 23/5383; H01L 23/49822; H01L 23/5226; H01L 21/4857; H01L 21/486; H01L 2224/02372; H01L 25/105; H01L 25/0657
See application file for complete search history.

(56) References Cited

U.S. PATENT DOCUMENTS 9,000,584 B2    4/2015    Lin et al.
9,048,222 B2    6/2015    Hung et al.
(Continued)

*Primary Examiner* — Antonio B Crite
(74) *Attorney, Agent, or Firm* — JCIPRNET

(57) ABSTRACT

A semiconductor package includes a first semiconductor die, a second semiconductor die, a semiconductor bridge, an integrated passive device, a first redistribution layer, and connective terminals. The second semiconductor die is disposed beside the first semiconductor die. The semiconductor bridge electrically connects the first semiconductor die with the second semiconductor die. The integrated passive device is electrically connected to the first semiconductor die. The first redistribution layer is disposed over the semiconductor bridge. The connective terminals are disposed on the first redistribution layer, on an opposite side with respect to the semiconductor bridge. The first redistribution layer is interposed between the integrated passive device and the connective terminals.

20 Claims, 36 Drawing Sheets

Related U.S. Application Data

(60) Provisional application No. 62/905,431, filed on Sep. 25, 2019.

(51) Int. Cl.
| | | |
|---|---|---|
| *H01L 21/56* | (2006.01) | |
| *H01L 23/00* | (2006.01) | |
| *H01L 23/31* | (2006.01) | |
| *H01L 23/498* | (2006.01) | |
| *H01L 23/522* | (2006.01) | |
| *H01L 25/00* | (2006.01) | |
| *H01L 25/065* | (2023.01) | |
| *H01L 25/10* | (2006.01) | |
| *H01L 25/16* | (2023.01) | |
| *H01L 21/683* | (2006.01) | |

(56) References Cited

U.S. PATENT DOCUMENTS

| | | |
|---|---|---|
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2017/0125379 A1* | 5/2017 | Chen .................... H01L 23/3142 |
| 2019/0131273 A1* | 5/2019 | Chen .................... H01L 21/6835 |
| 2019/0164888 A1* | 5/2019 | Chang Chien .... H01L 21/76843 |

\* cited by examiner

SEMICONDUCTOR PACKAGE AND MANUFACTURING METHOD THEREOF

CROSS-REFERENCE TO RELATED APPLICATION

This application is a continuation application of and claims the priority of a prior application Ser. No. 16/805,856, filed on Mar. 2, 2020. The prior application Ser. No. 16/805,856 claims the priority benefit of U.S. provisional application Ser. No. 62/905,431, filed on Sep. 25, 2019. The entirety of the above-mentioned patent application is hereby incorporated by reference herein and made a part of this specification.

BACKGROUND

Semiconductor devices and integrated circuits used in a variety of electronic apparatus, such as cell phones and other mobile electronic equipment, are typically manufactured on a single semiconductor wafer. The dies of the wafer may be processed and packaged with other semiconductor devices or dies at the wafer level, and various technologies and applications have been developed for wafer level packaging. Integration of multiple semiconductor devices has become a challenge in the field. To respond to the increasing demand for miniaturization, higher speed, and better electrical performance (e.g., lower transmission loss and insertion loss), more creative packaging and assembling techniques are actively researched.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
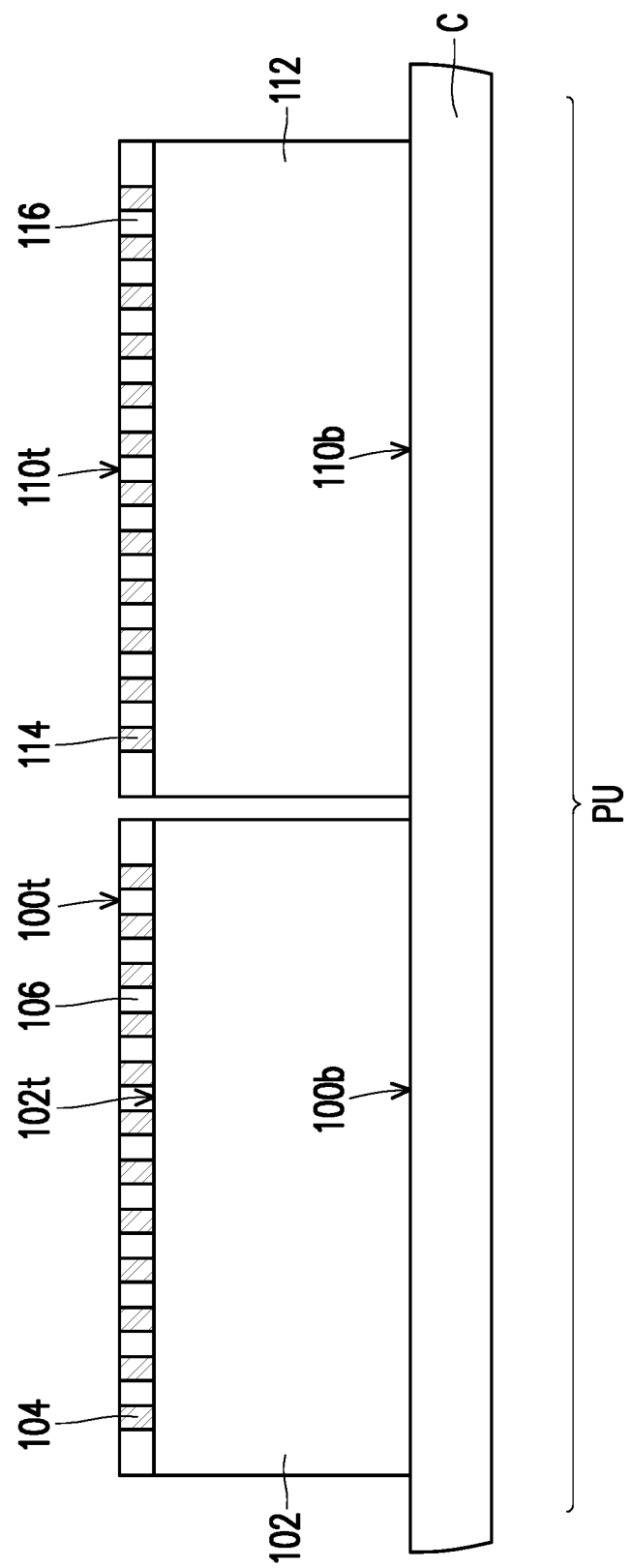
FIG. 1A to FIG. 1M are schematic cross-sectional views illustrating structures produced during a manufacturing process of a semiconductor package in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1M are schematic cross-sectional views illustrating structures produced during a manufacturing process of a semiconductor package SP10 in accordance with some embodiments of the disclosure. Referring to FIG. 1A, a carrier C is provided. In some embodiments, the carrier C is a glass substrate, a metal plate, a plastic supporting board or the like, but other suitable substrate materials may be used as long as the materials are able to withstand the subsequent steps of the process. In some embodiments, a de-bonding layer (not shown) may be formed over the carrier C. In some embodiments, the de-bonding layer includes a light-to-heat conversion (LTHC) release layer, which facilitates peeling the carrier C away from the semiconductor package when required by the manufacturing process.

In some embodiments, semiconductor dies 100, 110 are disposed side by side over the temporary carrier C with a pick-and-place process. In some embodiments, the semiconductor dies 100 include a semiconductor substrate 102, one or more contact pads 104, and a passivation layer 106. The contact pads 104 may be formed on a top surface 102t of the semiconductor substrate 102. The passivation layer 106 may cover the top surface 102t and have a plurality of openings that exposes at least a portion of each contact pad 104. In some embodiments, the semiconductor dies 100 may further include conductive posts (not shown) electrically connected to the contact pads 104 and a protective layer (not shown) disposed on the passivation layer 106 and surrounding the conductive posts. In some embodiments the passivation layer 106 may completely cover the contact pads 104 and (temporarily) constitute a top surface 100t of the semiconductor die 100. The semiconductor dies 110 may include similar components as just described for the semiconductor dies 100. For example, each semiconductor die 110 may include a semiconductor substrate 112, contact pads 114 and a passivation layer 116.

In some embodiments, the semiconductor dies 100, 110 are placed on the carrier C with the top surfaces 100t, 110t where the contact pads 104, 114 are located facing away from the carrier C. Backside surfaces 100b, 110b of the semiconductor dies 100, 110 opposite to the top surfaces 100t, 110t may be in contact with the carrier C (or the die attach film, if included). In some embodiments, the semiconductor dies 100, 110 included in a semiconductor package may have different sizes, or components of different sizes. For example, the semiconductor dies 100, 110 may differ for the thickness of the semiconductor substrates 102, 112, the number of contact pads 104, 114, whether conductive posts are included or not, and so on.

In some embodiments, the semiconductor substrates 102, 112 are made of semiconductor materials, such as semiconductor materials of the groups III-V of the periodic table. In some embodiments, the semiconductor substrates 102, 112 include elementary semiconductor materials such as silicon or germanium, compound semiconductor materials such as silicon carbide, gallium arsenide, indium arsenide, or indium phosphide or alloy semiconductor materials such as silicon germanium, silicon germanium carbide, gallium arsenide phosphide, or gallium indium phosphide. In some embodiments, the semiconductor substrates 102, 112 include active components (e.g., transistors or the like) and optionally passive components (e.g., resistors, capacitors, inductors, or the like) formed therein. In certain embodiments, the contact pads 104, 114 include aluminum pads, copper pads, or other suitable metal pads. In some embodiments, the passivation layers 106, 116 may be a single layer or a multi-layered structure, including a silicon oxide layer, a silicon nitride layer, a silicon oxy-nitride layer, a dielectric layer formed by other suitable dielectric materials or combinations thereof.

Each semiconductor die 100, 110 may independently be or include a logic die, such as a central processing unit (CPU) die, a graphic processing unit (GPU) die, a micro control unit (MCU) die, an input-output (I/O) die, a baseband (BB) die, or an application processor (AP) die. In some embodiments, some of the semiconductor dies 100, 110 may be memory dies. That is, the semiconductor dies 100, 110 are or function as active devices.

Figure 1B:
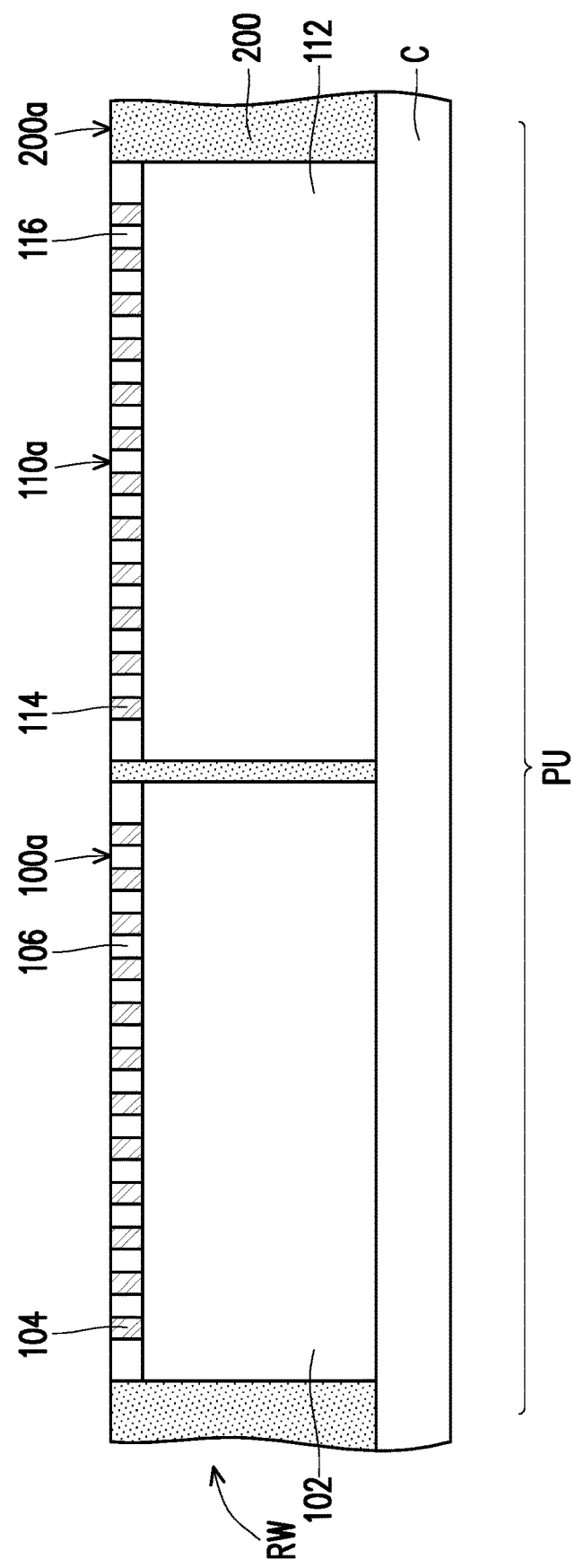

Referring to FIG. 1B, an encapsulant 200 is formed over the carrier C to encapsulate the semiconductor dies 100, 110. The encapsulant 200 laterally encircles the semiconductor dies 100, 110, extending also in the gaps in between the semiconductor dies 100, 110. In some embodiments, a material of the encapsulant 200 includes a molding compound, a polymeric material, such as polyimide, epoxy resin, acrylic resin, phenol resin, benzocyclobutene (BCB), polybenzooxazole (PBO), a combination thereof, or other suitable polymer-based dielectric materials. The encapsulant 200 may be formed by a sequence of over-molding and planarization steps. For example, the encapsulant 200 may be originally formed by a molding process (such as a compression molding process) or a spin-coating process to completely cover the semiconductor dies 100, 110. In some embodiments, the planarization of the encapsulant 200 includes performing a mechanical grinding process and/or a chemical mechanical polishing (CMP) process. In some embodiments, the planarization process is performed until the contact pads 104, 114 of the semiconductor dies 100, 110 are exposed. In some embodiments, portions of the passivation layers 106, 116 are also removed during the planarization process of the encapsulant 200. In some embodiments, following the planarization process, the top surfaces 100t, 110t of the semiconductor dies 100, 110 (the contact surfaces exposing the contact pads 104, 114 or the conductive posts if included) and the top surface 200a of the encapsulant 200 may be substantially at a same level height (be substantially coplanar). With the formation of the encapsulant 200, a reconstructed wafer RW is obtained. In some embodiments, the reconstructed wafer RW includes a plurality of package units PU. In other words, the exemplary process may be performed at a reconstructed wafer level, so that multiple package units PU are processed in the form of the reconstructed wafer RW. In the cross-sectional view of FIG. 1B, a single package unit PU is shown for simplicity but, of course, this is for illustrative purposes only, and the disclosure is not limited by the number of package units PU being produced in the reconstructed wafer RW.

Figure 1C:
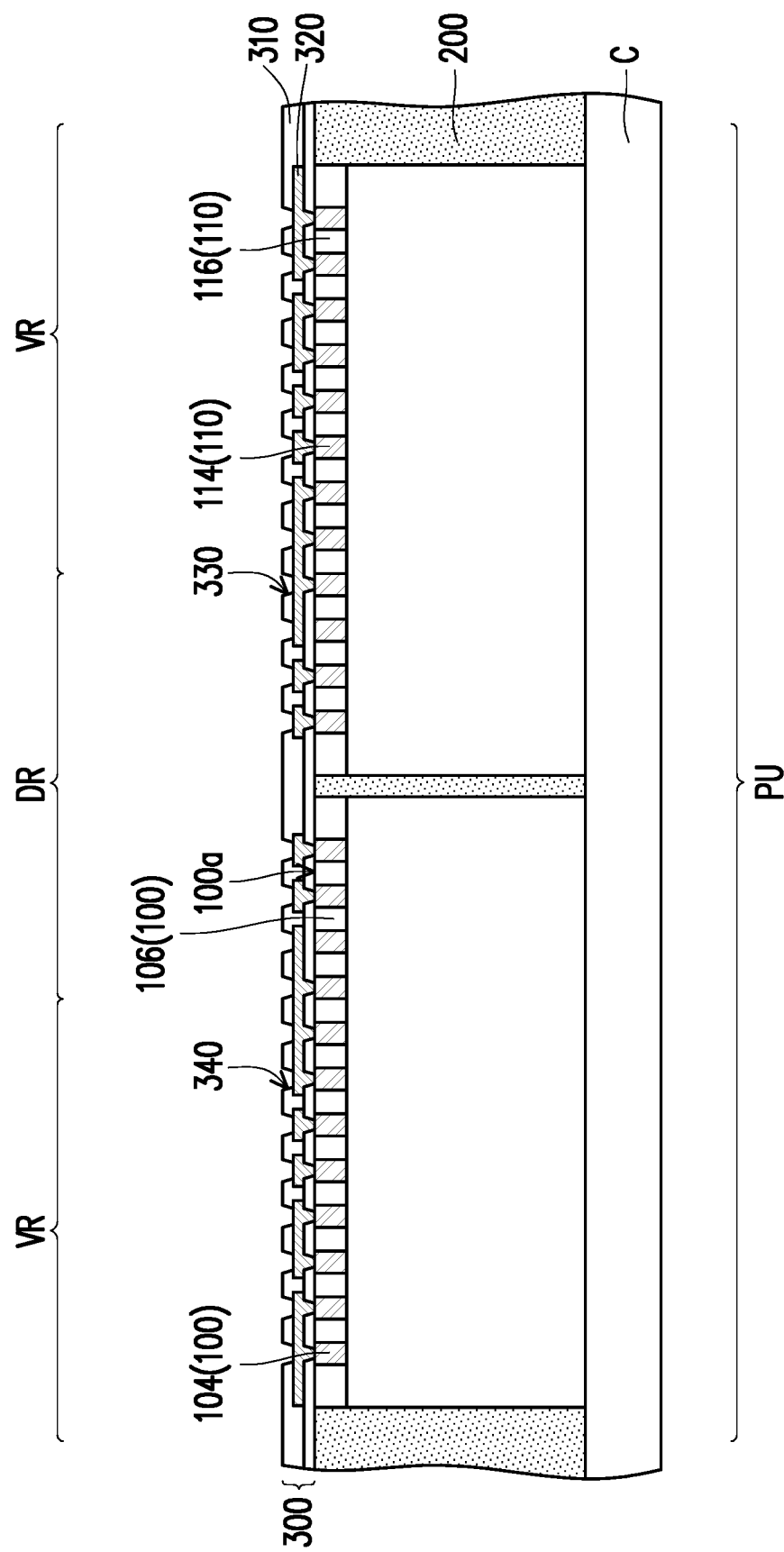

Referring to FIG. 1C, in some embodiments, an inner redistribution layer 300 is formed on the semiconductor dies 100, 110 and the encapsulant 200 over the carrier C. In some embodiments, the inner redistribution layer 300 includes dielectric layers 310 alternately stacked with one or more metallization tiers 320. In some embodiments, the dielectric layers 310 are constituted by at least two dielectric layers. The metallization tier 320 includes routing conductive traces sandwiched between pairs of adjacent dielectric layers 310. In some embodiments, a material of the dielectric layers 310 includes polyimide, epoxy resin, acrylic resin, phenol resin, benzocyclobutene (BCB), polybenzooxazole (PBO), combinations thereof, or any other suitable polymer-based dielectric material. The dielectric layers 310 may be formed by suitable fabrication techniques such as spin-on coating, chemical vapor deposition (CVD), or the like. In some embodiments, a material of the metallization tier 320 includes copper, aluminum, or the like. In some embodiments, the material of the metallization tier 120 includes copper. Throughout the description, the term "copper" is intended to include substantially pure elemental copper, copper containing unavoidable impurities, and copper alloys containing elements such as tantalum, indium, tin, zinc, manganese, chromium, titanium, germanium, strontium, platinum, magnesium, aluminum, or zirconium. The metallization tier 120 may be formed by, for example, electroplating, deposition, and/or photolithography and etching. In some alternative embodiments, more metallization tiers 320 and more dielectric layers 310 than the ones illustrated in FIG. 1C may be formed depending on production requirements. In these embodiments, each metallization tier is sandwiched between a pair of consecutive dielectric layers.

In some embodiments, the innermost dielectric layer 310 (the dielectric layer 310 closer to the semiconductor dies 100, 110) is patterned to include openings exposing portions of the contact pads 104, 114. The metallization tier 320 may fill the openings to establish electrical contact with the semiconductor dies 100, 110. In some embodiments, the outermost dielectric layer 310 (the dielectric layer 310 further away from the semiconductor dies 100, 110) is patterned to include openings 330 and 340 exposing portions of the (outermost) metallization tier 320. In some embodiments, the inner redistribution layer 300 includes one or more device attach regions DR in which the openings 330 are located, and one or more interconnect via regions VR in which the openings 340 are located. In some embodiments, the device attach region DR is located towards a central portion of the package unit PU, extending over portions of adjacent semiconductor dies 100, 110, and is surrounded by interconnect via regions VR. In some embodiments, one interconnect via region VR may extend on one side of the device attach region DR and another interconnect via region may extend on an opposite side of the device attach region DR. In some embodiments, the interconnect via regions VR may be separated by the device attach region DR. In some alternative embodiments, the interconnect via region VR may have an annular shape encircling the device attach region DR.

Figure 1D:
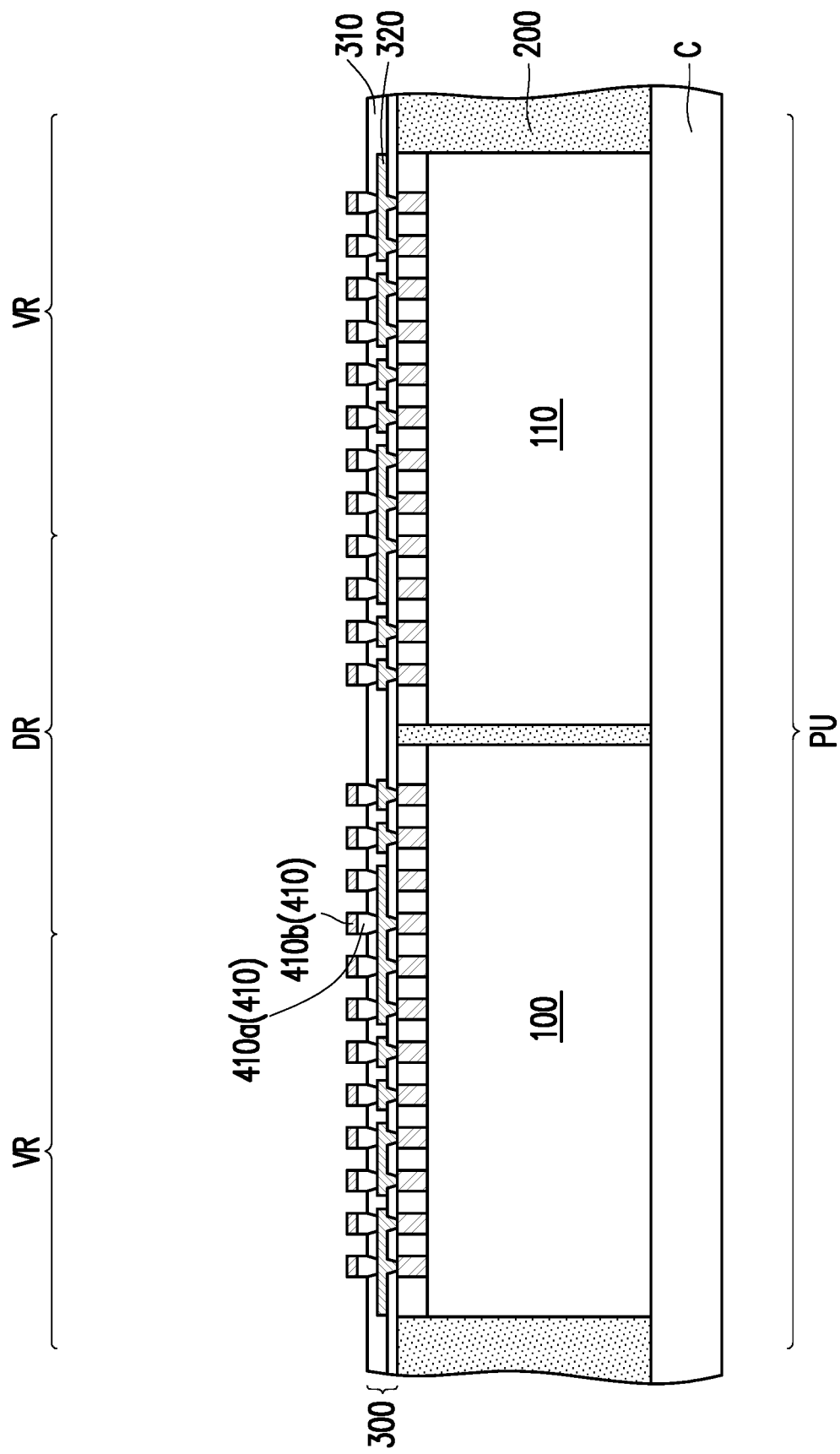

Referring to FIG. 1D, in some embodiments contact pads 410 are formed in the openings 330 and 340. In some embodiments, the contact pads 410 include a base layer 410a formed in the openings 330 and 340 and contacting the metallization tier 320, and a bonding layer 410b stacked on the base layer 410a. In some embodiments, a material of the base layer 410a may include mostly copper, possibly in combination with other metals, and a material for the bonding layer 410b includes copper. In some embodiments, a seed layer (not shown) may be formed before the base layer 410a, and be disposed in between the base layer 410a and the metallization tier 320 or the dielectric layer 310. The base layer 410a may be plated on the seed layer, and the bonding layer 410b may be plated on the base layer 410a. In some embodiments, the contact pads 410 are electrically connected with the underlying semiconductor die 100 or 110. That is, the contact pads 410 overlying the semiconductor die 100 may be connected to the semiconductor die 100 (but not the semiconductor die 110), and the contact pads 410 overlying the semiconductor die 110 may be connected to the semiconductor die 110 (but not the semiconductor die 100). That is, the inner redistribution layer 300 may not directly interconnect the semiconductor dies 100 and 110.

Figure 1E:
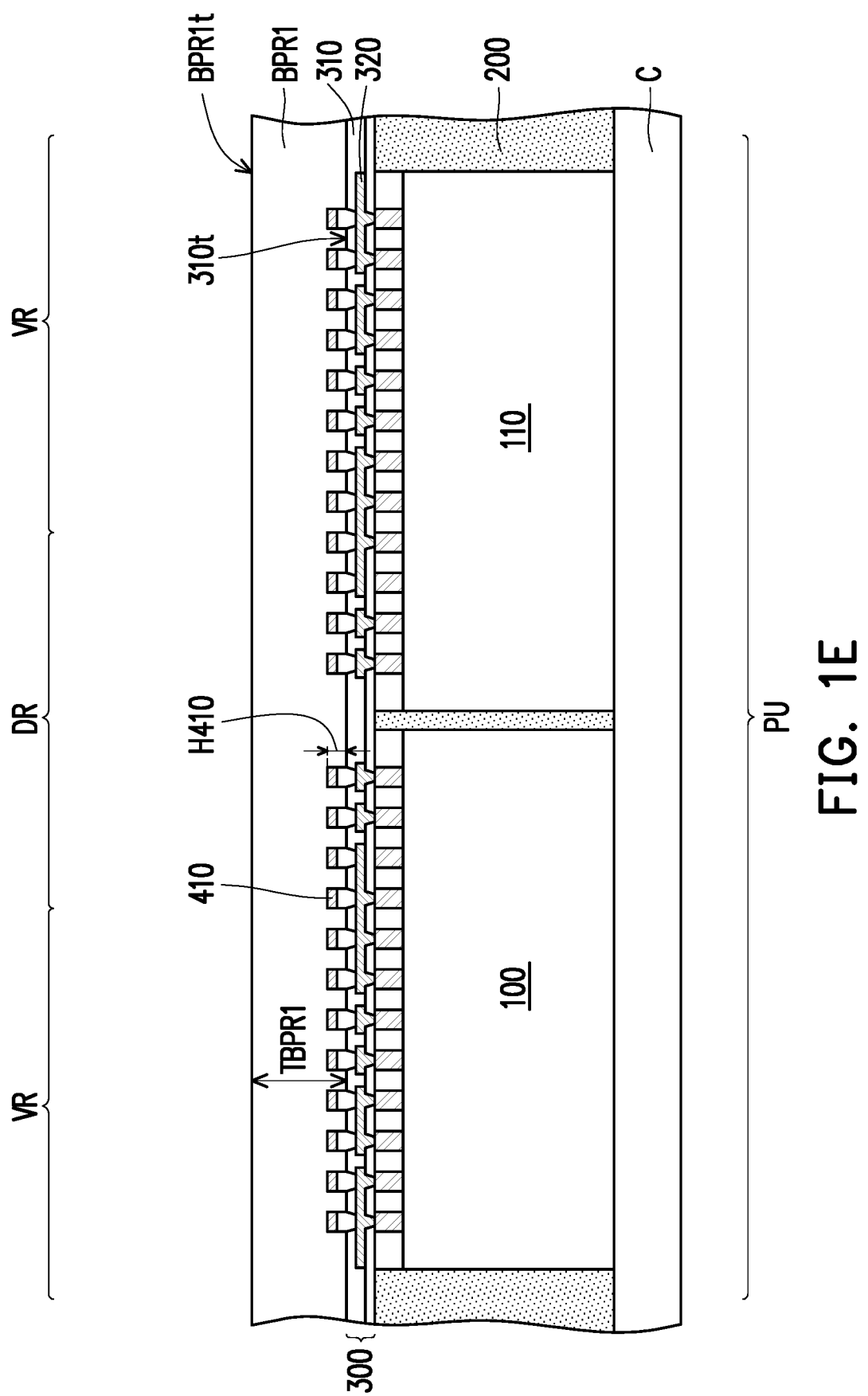

Referring to FIG. 1E, in some embodiments a blanket photoresist layer BPR1 is disposed on the inner redistribution layer 300. The thickness TBPR1 of the blanket photoresist layer BPR1 may be such that the contact pads 410 are completely covered by the blanket photoresist layer BPR1, and the blanket photoresist layer BPR1 may extend over the contact pads 410. In some embodiments, the thickness TBPR1 of the blanket photoresist layer BPR1 measured from the top surface 310t of the dielectric layer 310 to the top surface BPR1t of the blanket photoresist layer BPR1 may be in the range from 3 micrometers to 10 micrometers. In some embodiments, the thickness TBPR1 may be from 10 to 15 times the protruding height H410 of the contact pads 410 over the inner redistribution layer 300. The protruding height H410 may be considered as the distance between the level height reached by the contact pads 410 and the top surface 310t of the dielectric layer 310. In some embodiments, the blanket photoresist layer BPR1 includes a negative photoresist or a positive photoresist. In some embodiments, the blanket photoresist layer BPR1 is laminated as a dry film on the inner redistribution layer 300.

Figure 1F:
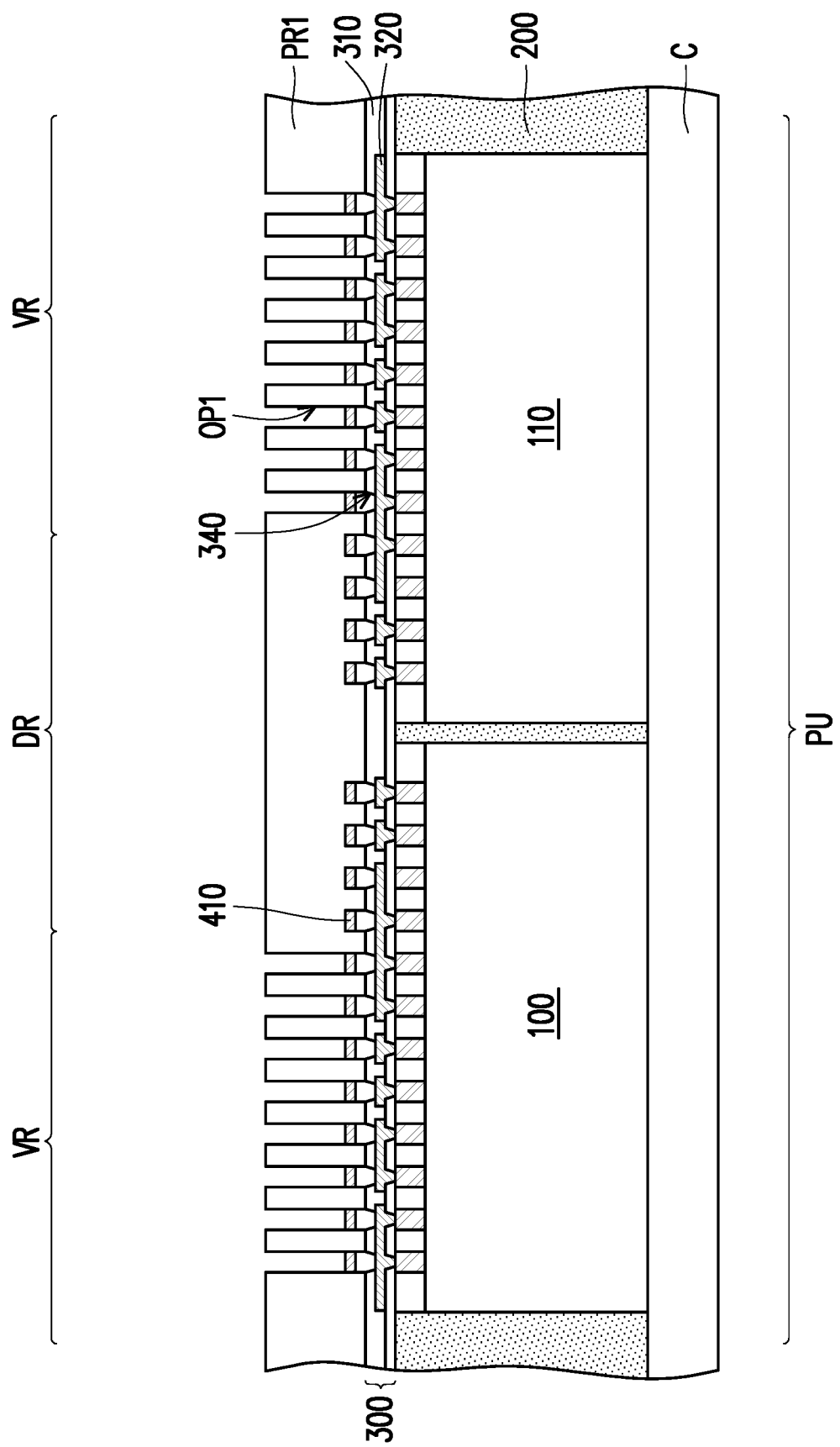
Figure 1G:
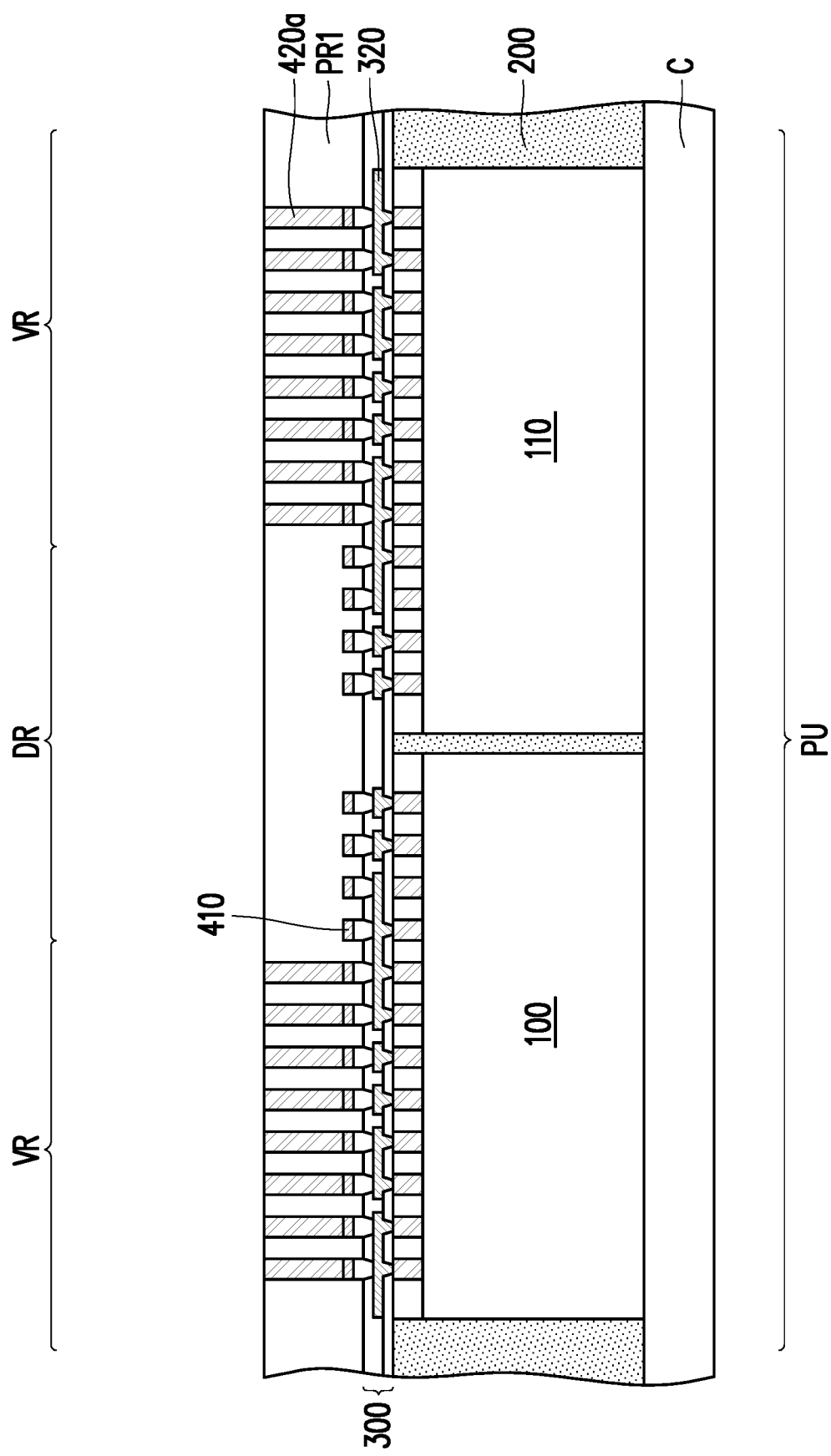

Referring to FIG. 1E and FIG. 1F, the blanket photoresist layer BPR1 may be patterned (for example, via exposure and development steps) to form a photoresist layer PR1 including openings OP1 exposing the contact pads 410 in the interconnect via region(s) VR. Referring to FIG. 1F and FIG. 1G, a conductive material 420a is disposed in the openings OP1 on the contact pads 410. In some embodiments, the conductive material 420a may include copper, nickel, tin, palladium, gold, titanium, aluminum, or alloys thereof. In some embodiments, the conductive material 420a may be formed by a plating process. The plating process may be, for example, electro-plating, electroless-plating, immersion plating, or the like. In some embodiments, the conductive material 420a may be deposited on a seed layer (not shown) provided before the photoresist layer PR1. In some embodiments, the formation of the seed layer may be skipped, as the contact pads 410 can seed the deposition of the conductive material 420a.

Figure 1H:
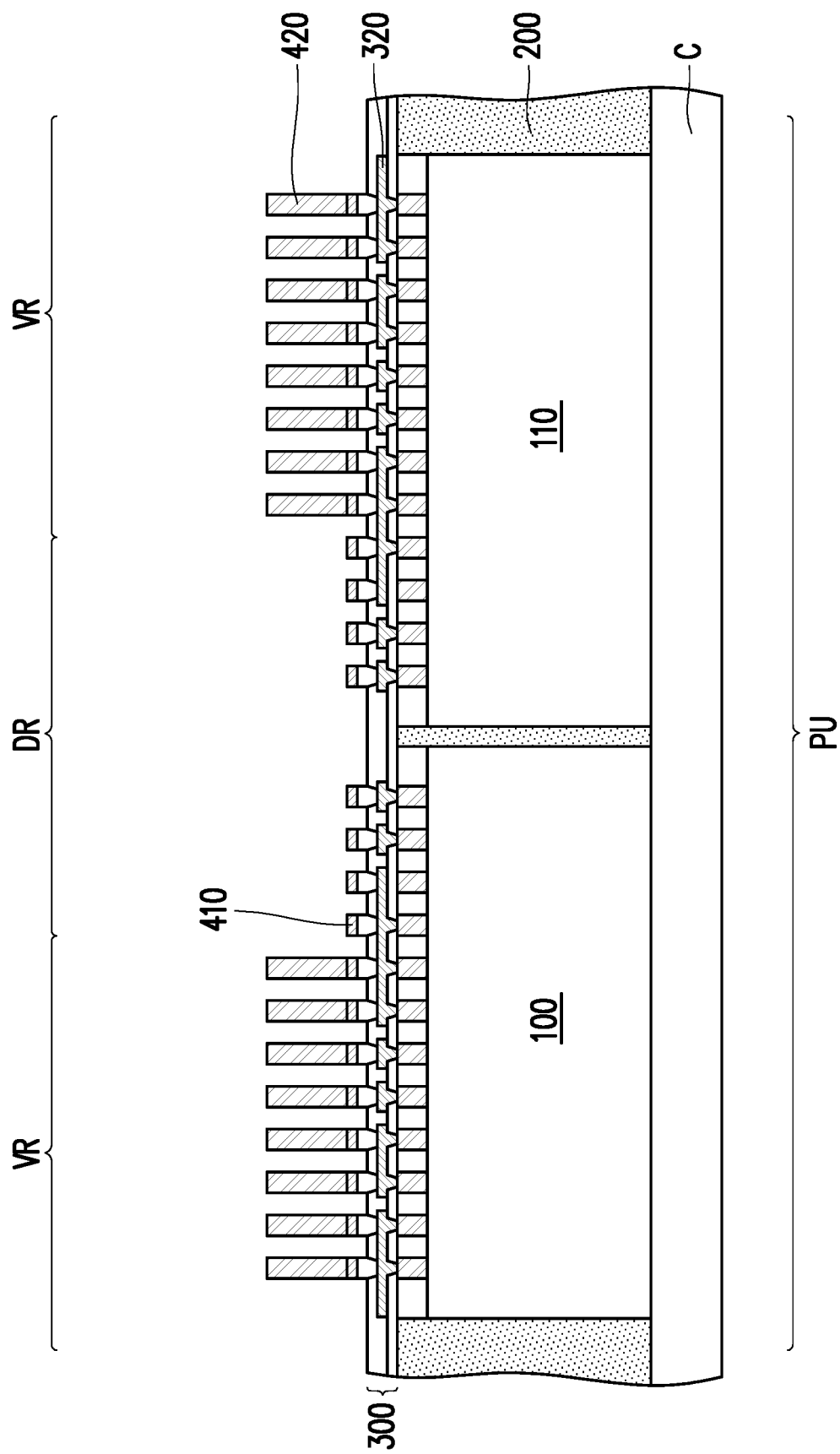

In some embodiments, referring to FIG. 1G and FIG. 1H, the photoresist layer PR1 may be removed or stripped through, for example, etching, ashing, or other suitable removal processes. In some embodiments, the conductive material 420a located in the openings OP1 forms the through interconnection vias (TIVs) 420. Upon removal of the photoresist layer PR1, portions of seed layer not covered by the TIVs 420 are removed, for example, through an etching process. In some embodiments, the material of the TIVs 420 is different from the material of the seed layer, so the portions of the seed layer exposed after removal of the photoresist layer PR1 may be removed through selective etching. However, the disclosure is not limited thereto. In some alternative embodiments, other suitable methods may be utilized to form the TIVs 420. For example, pre-fabricated TIVs 420 (e.g., pre-fabricated conductive pillars) may be picked-and-placed onto the inner redistribution layer 300.

Figure 1I:
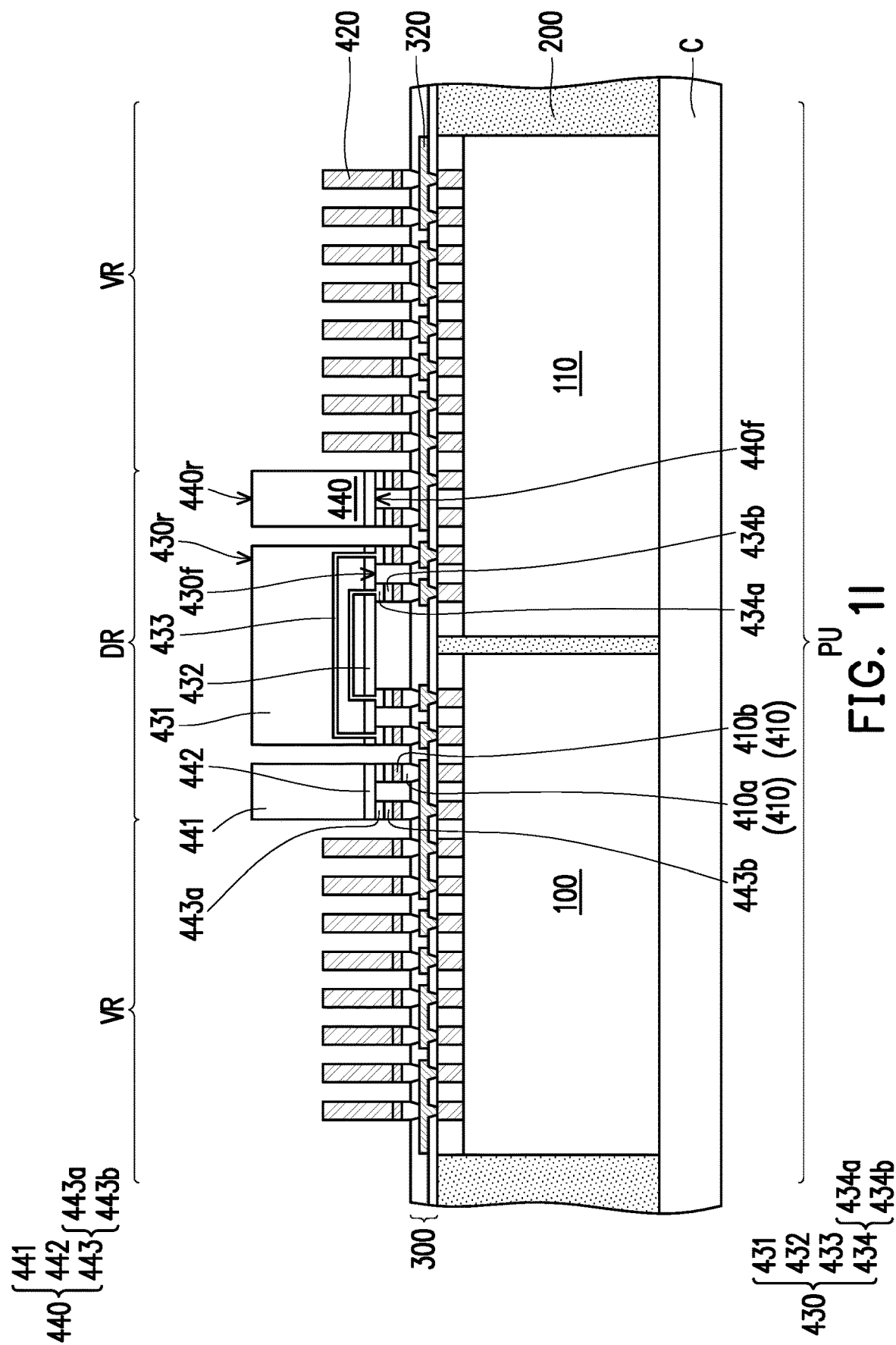

Referring to FIG. 1I, in some embodiments, a semiconductor bridge 430 and integrated passive devices 440 are connected to the contact pads 410 in between the TIVs 420, in the device attach region DR. The semiconductor bridge 430 is bonded to some of the contact pads 410 electrically connected to the semiconductor die 100 and to some of the contact pads 410 electrically connected to the semiconductor die 110, so to establish electrical connection between the semiconductor dies 100 and 110. As illustrated in FIG. 1I, in some embodiments, the semiconductor bridge 430 includes a semiconductor substrate 431, a dielectric layer 432 disposed at a front surface 430f of the semiconductor bridge 430, and interconnection conductive patterns 433 embedded in the dielectric layer 432 and the semiconductor substrate 431. The semiconductor substrate 431 may be made of suitable semiconductor materials, similar to what was previously discussed for the semiconductor substrates of the semiconductor dies 100, 110. The interconnection conductive patterns 433 are in electrical contact with conductive terminals 434 formed on the dielectric layer 432 at the front surface 430f of the semiconductor bridge 430. The conductive terminals 434 may be micro-bumps. For example, the conductive terminals 434 may include a conductive post 434a and a solder cap 434b disposed on the conductive post 434a. In some embodiments, the conductive posts 434a may be copper posts. However, the disclosure is not limited thereto, and other conductive structures such as solder bumps, gold bumps or metallic bumps may also be used as the conductive terminals 434. In some embodiments, the semiconductor bridge 430 is disposed with the front surface 430f directed towards the semiconductor dies 100, 110, so that the conductive terminals 434 can be bonded to the contact pads 410. That is, the solder cap 434b may be disposed on the bonding layer 410b of the contact pads 410 to establish electrical connection. In some embodiments, the interconnection conductive patterns 433 of the semiconductor bridge 430 electrically connect the semiconductor dies 100 and 110 through the intervening contact pads 410. The conductive terminals 434 may be bonded to the contact pads 410 through a reflow process. Upon bonding the semiconductor bridge 430 to the contact pads 410, electrical connection between the semiconductor dies 100 and 110 is established through the inner redistribution layer 300, the contact pads 410, the conductive terminals 434 and the interconnection conductive patterns 433. In some embodiments, the inner redistribution layer 300 does not directly interconnect the semiconductor dies 100, 110. In some embodiments, the semiconductor bridge 430 connects at least one contact pad 410 electrically connected to the semiconductor die 100 to another contact pad 410 connected to the semiconductor die 110. In some embodiments, the semiconductor bridge 430 connects one or more contact pads 410 overlying the semiconductor die 100 with one or more contact pads 410 overlying the semiconductor die 110. In some embodiments, where a gap exists between adjacent semiconductor dies 100, 110, the semiconductor bridge 430 extends over such gap. In some embodiments, the semiconductor bridge 430 functions as an interconnecting structure for adjacent semiconductor dies 100, 110 and provides shorter electrical connection paths between the adjacent semiconductor dies 100, 110.

In some embodiments, the integrated passive devices 440 are provided on the contact pads 410 not occupied by the semiconductor bridge 430 in the device attach region DR. In some embodiments, the integrated passive devices 440 are placed over the carrier C through a pick-and-place method. Even though only two integrated passive devices 440 are presented in FIG. 1I within a package unit PU for illustrative purposes, the disclosure is not limited by the number of integrated passive devices 440 included in a package unit PU. In some embodiments, an individual integrated passive device 440 includes a semiconductor substrate 441, a dielectric layer 442 formed on the semiconductor substrate 441 at a front surface 440f of the integrated passive device 440, and conductive terminals 443 formed on the front surface 440f. The semiconductor substrate 441 may be made of suitable semiconductor materials, similar to what was previously discussed for the semiconductor substrates of the semiconductor dies 100, 110. In some embodiments, the integrated passive devices 440 are chips of integrated passive devices and function as capacitors, inductors, resistors, or the like. In some embodiments, each integrated passive device 440 may independently function as a capacitor having different capacitance values, resonance frequencies, and/or different sizes, an inductor, or the like. In some embodiments the conductive terminals 443 may be micro-bumps. For example, the conductive terminals 443 may include a conductive post 443a and a solder cap 443b disposed on the conductive post 443a. In some embodiments, the conductive posts 443a may be copper posts. However, the disclosure is not limited thereto, and other conductive structures such as solder bumps, gold bumps or metallic bumps may also be used as the conductive terminals 443. In some embodiments, the integrated passive devices 440 are disposed with the front surfaces 440f directed towards the semiconductor dies 100, 110, so that the conductive terminals 443 can be bonded to the contact pads 410. That is, the solder caps 443b may be disposed on the contact pads 410 to establish electrical connection with the semiconductor dies 100, 110. In some embodiments, the rear surfaces 430r, 440r of the semiconductor bridge 430 and the integrated passive devices 440 (the surfaces 430r, 440r opposite to the corresponding front surfaces 430f, 440f) may be located at a level height higher than the level height reached by the TIVs 420 with respect to the inner redistribution layer 300.

Figure 1J:
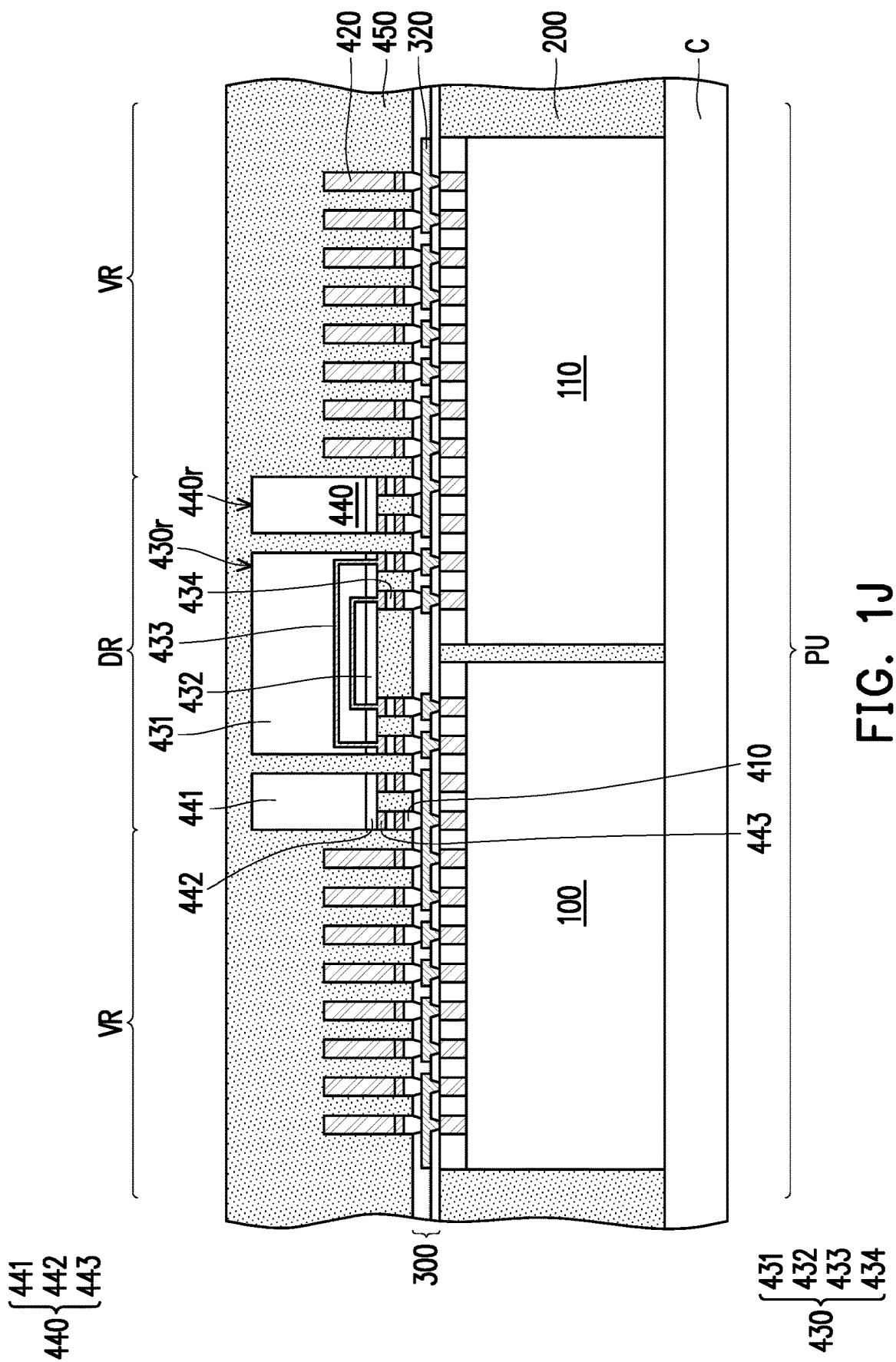
Figure 1K:
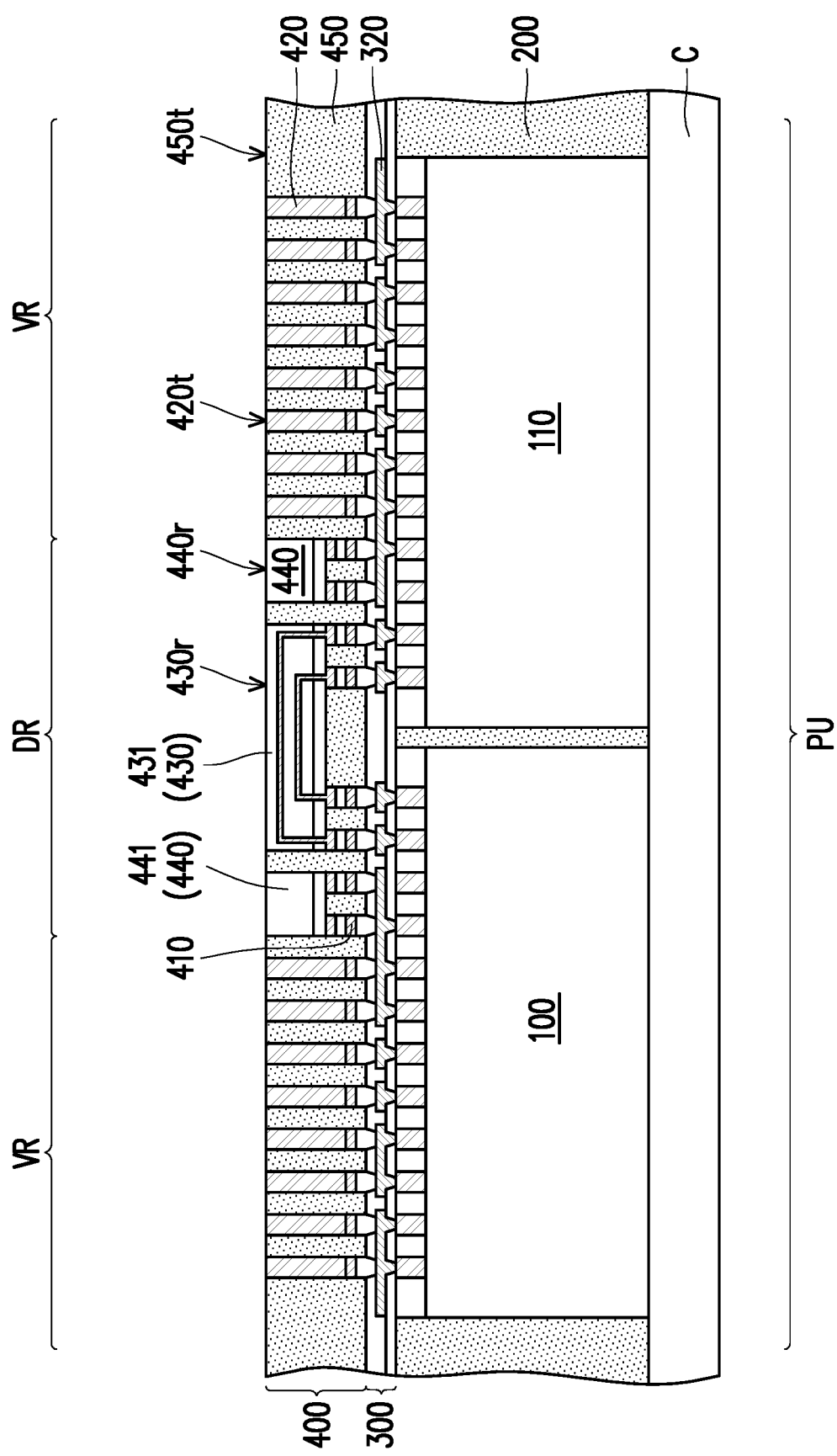

Referring to FIG. 1J, in some embodiments, an encapsulant 450 is formed on the inner redistribution layer 300, encapsulating the contact pads 410, the TIVs 420, the semiconductor bridge 430 and the integrated passive devices 440. In some embodiments, the encapsulant 450 is formed through an over-molding process, for example, through a compression molding process. The encapsulant 450 may initially cover the TIVs 420 and the rear surfaces 430r, 440r of the semiconductor bridge 430 and the integrated passive devices 440, respectively. In some embodiments, similar materials as the ones listed above for the encapsulant 200 may be used for the encapsulant 450. Referring to FIG. 1J and FIG. 1K, the encapsulant 450 may be thinned until the TIVs 420 are exposed. For example, a planarization process may be performed removing portions of the encapsulant 450 and, if needed, of the semiconductor substrates 431, 441 of the semiconductor bridge 430 and the integrated passive devices 440 from the side of the rear surfaces 430r, 440r. In some embodiments, the planarization of the encapsulant 450 includes performing a mechanical grinding process and/or a chemical mechanical polishing (CMP) process. Following planarization, top surfaces 420t of the TIVs 420, the rear surface 430r of the semiconductor bridge 430, the rear surfaces 440r of the integrated passive devices 440, and the top surface 450t of the encapsulant 450 may be substantially flush with respect to each other (be at substantially the same level height, coplanar with respect to each other). In some embodiments, the contact pads 410, the TIVs 420, the semiconductor bridge 430, the integrated passive devices 440, and the encapsulant 450 are considered parts of a bridging layer 400 stacked on the inner redistribution layer 300. That is, the semiconductor bridge 430 and the integrated passive devices 440 are embedded in the bridging layer 400.

Figure 1L:
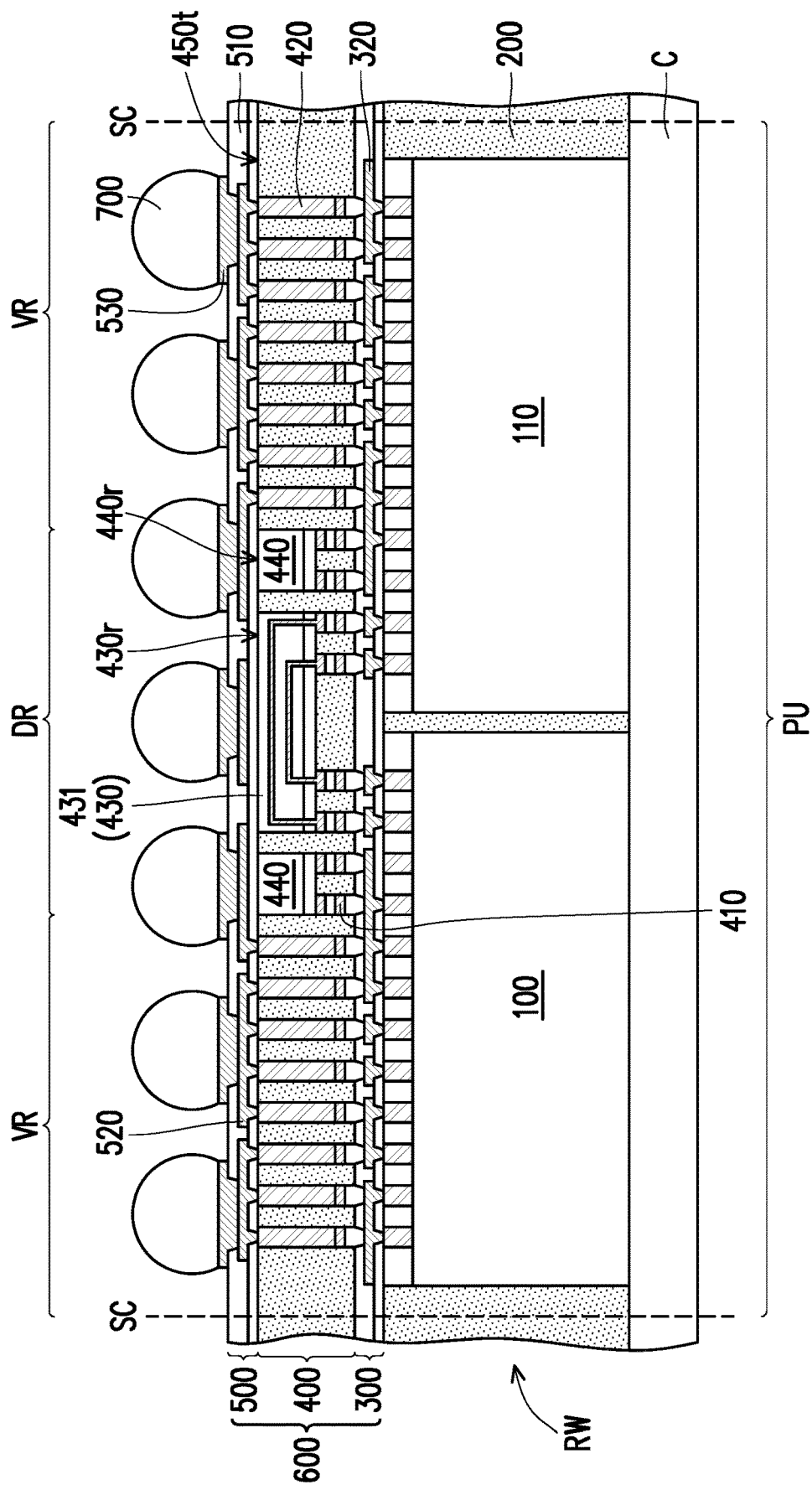

Referring to FIG. 1L, an outer redistribution layer 500 is formed on the bridging layer 400. The outer redistribution layer 500 includes dielectric layers 510, one or more metallization tiers 520, and, optionally, under-bump metallurgies 530. The outer redistribution layer 500 may have a similar structure and be formed following similar processes as the ones previously described for the inner redistribution layer 300, and a detailed description thereof is omitted herein. In some embodiments, the (outermost) dielectric layer 510 is patterned to expose the underlying metallization tier 520. The under-bump metallurgies 530 are optionally conformally formed in the openings of the (outermost) dielectric layer 510 exposing the metallization tier 520, and may further extend over portions of the exposed surface of the (outermost) dielectric layer 510. In some embodiments, the under-bump metallurgies 530 include multiple stacked layers of conductive materials. For example, the under-bump metallurgies 530 may include one or more metallic layers stacked on a seed layer. In some embodiments, the inner redistribution layer 300, the bridging layer 400, and the outer redistribution layer 500 may collectively form a redistribution structure 600, having embedded therein the semiconductor bridge 430 and the integrated passive devices 440.

Connective terminals 700 are formed on the redistribution structure 600 on an opposite side with respect to the semiconductor dies 100, 110, on the under-bump metallurgies 530 (if included) of the outer redistribution layer 500. In some embodiments, the connective terminals 700 are formed on the under-bump metallurgies 530, and are connected to the TIVs 420 and the semiconductor die(s) 100, 110 via the metallization tiers 520 and 320. In some embodiments, the connective terminals 700 are attached to the under-bump metallurgies 530 through a solder flux. In some embodiments, the connective terminals 700 are controlled collapse chip connection (C4) bumps. In some embodiments, the connective terminals 700 include a conductive material with low resistivity, such as Sn, Pb, Ag, Cu, Ni, Bi, or an alloy thereof.

Figure 1M:
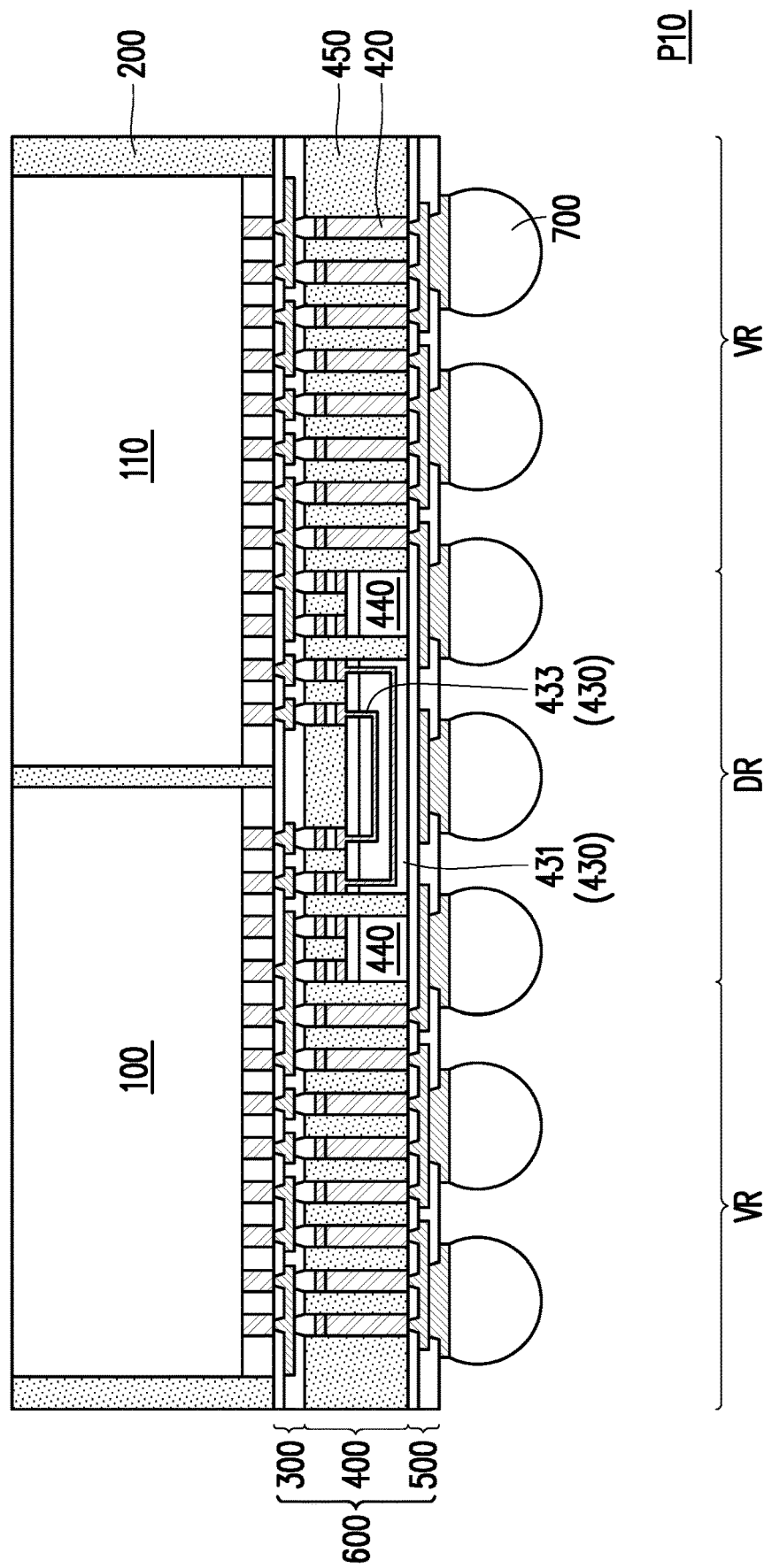

In some embodiments, referring to FIG. 1L and FIG. 1M, a singulation step is performed to separate the individual semiconductor packages P10, for example, by cutting through the reconstructed wafer RW along the scribe lanes SC arranged between individual package units PU. In some embodiments, the singulation process typically involves performing a wafer dicing process with a rotating blade and/or a laser beam. In some embodiments, the carrier C is separated from the semiconductor packages SP10 following singulation. When the de-bonding layer (e.g., the LTHC release layer) is included, the de-bonding layer may be irradiated with a UV laser so that the carrier C and the de-bonding layer are easily peeled off from the semiconductor packages SP10. Nevertheless, the de-bonding process is not limited thereto, and other suitable de-bonding methods may be used in some alternative embodiments.

FIG. 1M is a schematic cross-sectional view of the semiconductor package SP10 according to some embodiments of the disclosure. The semiconductor package SP10 may include the semiconductor dies 100, 110, the encapsulant 200, the redistribution structure 600 including the redistribution layers 300 and 500 and the bridging layer 400, and the connective terminals 700. In some embodiments, the inner redistribution layer 300 is formed on the semiconductor dies 100, 110 and the encapsulant 200, the bridging layer 400 is formed on the inner redistribution layer 300, and the outer redistribution layer 500 is formed on the bridging layer 400. In some embodiments, the inner redistribution layer 300 and the outer redistribution layer 500 are connected by the TIVs 420 of the bridging layer 400. The TIVs 420 may be formed in the interconnect via region VR of the semiconductor package P10. The semiconductor package P10 further includes a device attach region DR, in which the semiconductor bridge 430 and the integrated passive devices 440 are disposed within the bridging layer 400. That is, the semiconductor bridge 430 and the integrated passive devices 440 are buried (embedded) within the bridging layer 400. That is, the integrated passive devices 440 are closer to the semiconductor dies 100, 110 with respect to the connective terminals 700. In some embodiments, by burying the integrated passive devices 440 within the bridging layer 400, a connection distance between the integrated passive devices 440 and the semiconductor dies 100, 110 may be shortened, simplifying the routing of the redistribution structure 600 and increasing the efficiency of the semiconductor package P10. In some embodiments, the increase in efficiency may be achieved without substantially increasing the thickness of the semiconductor package P10.

Figure 1N:
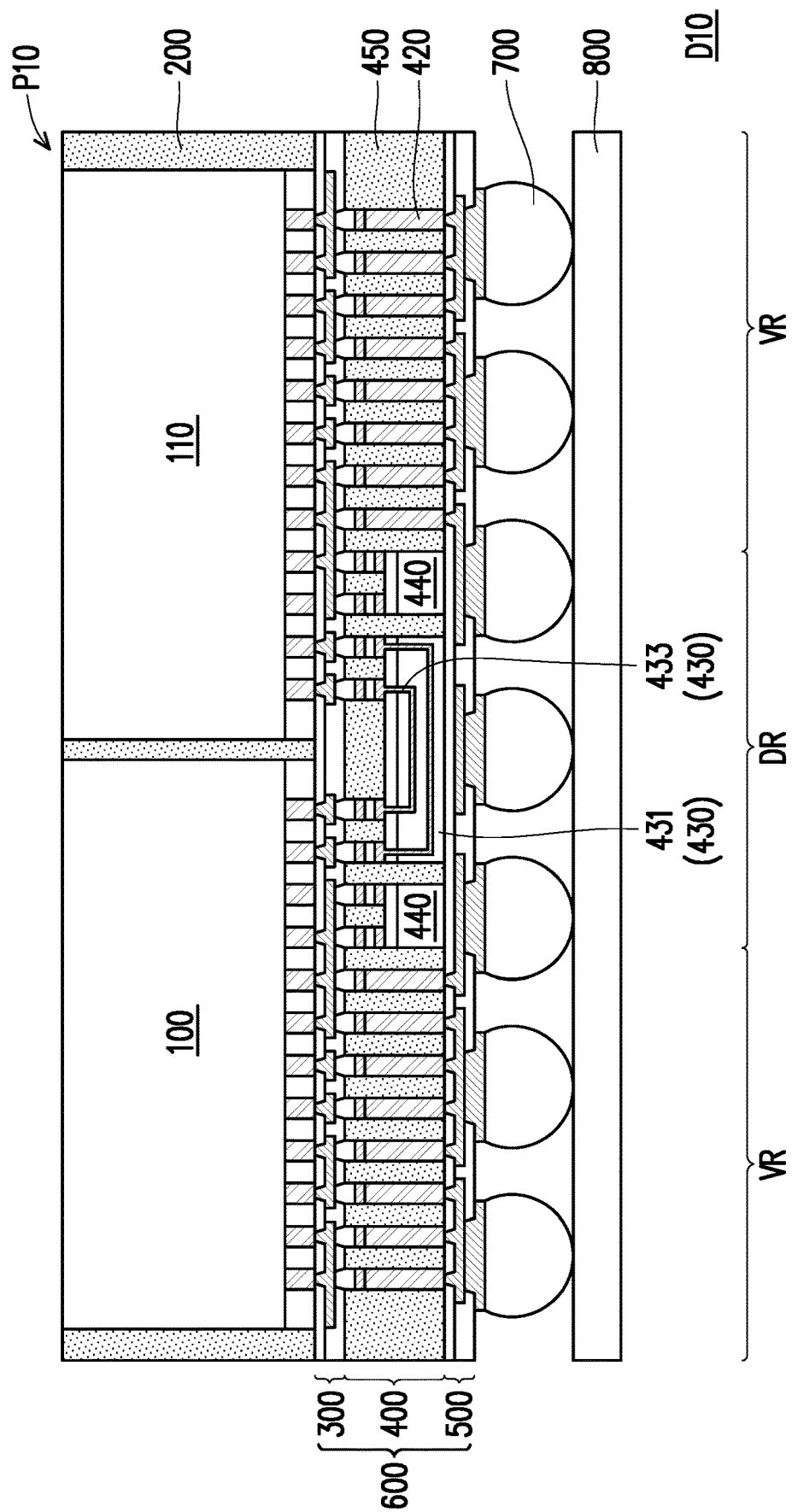
FIG. 1N is a schematic cross-sectional view illustrating an electronic device in accordance with some embodiments of the disclosure.

As illustrated in FIG. 1N, in some embodiments the connective terminals 700 may be used to integrate the semiconductor package P10 in larger electronic devices (e.g., the electronic device D10). For example, the semiconductor package P10 may be connected to a circuit substrate 800 such as a mother board, a printed circuit board, or the like, via the connective terminals 700.

Figure 2A:
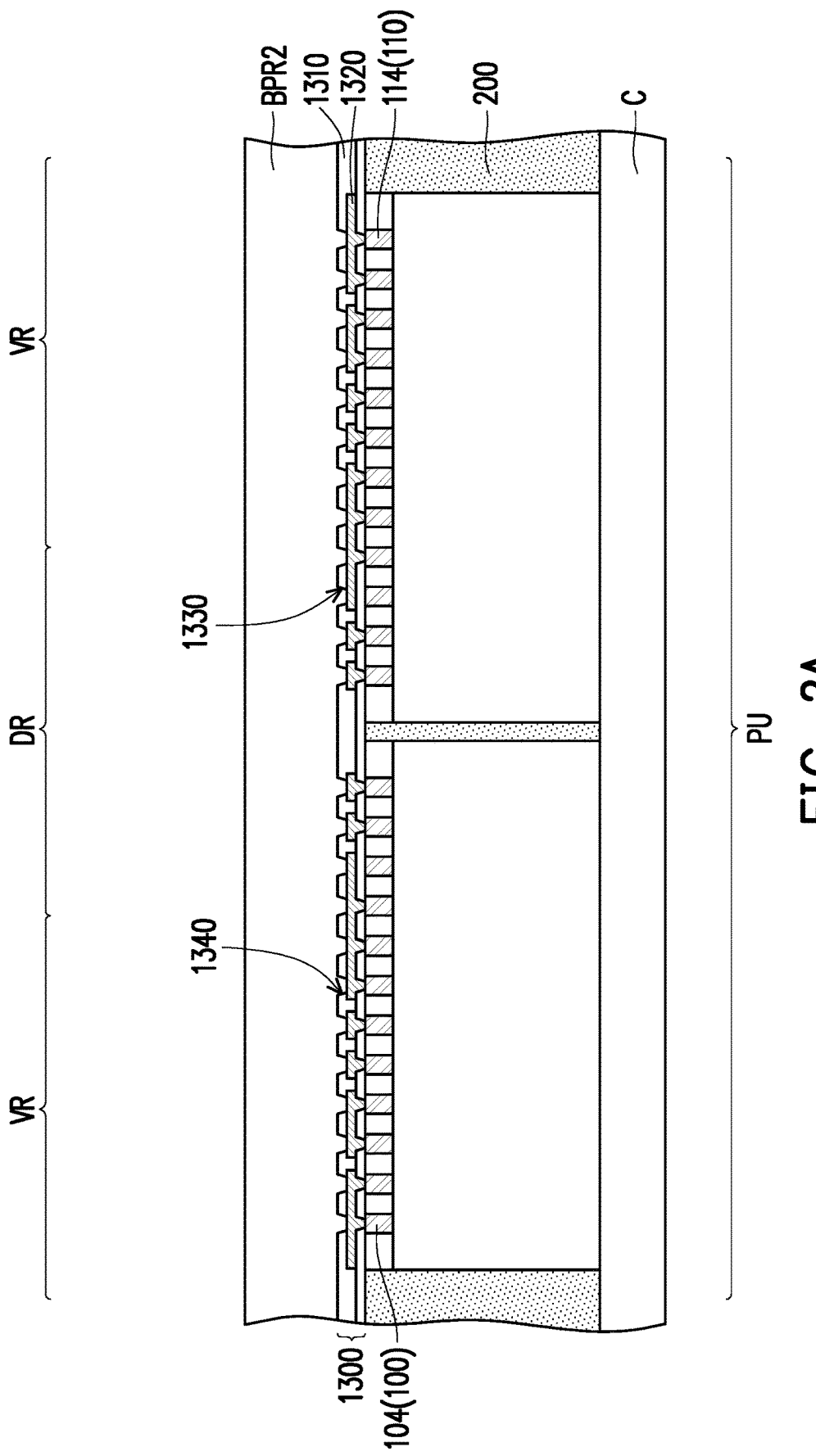
FIG. 2A to FIG. 2F are schematic cross-sectional views illustrating structures produced during a manufacturing process of a semiconductor package in accordance with some embodiments of the disclosure.
Figure 2B:
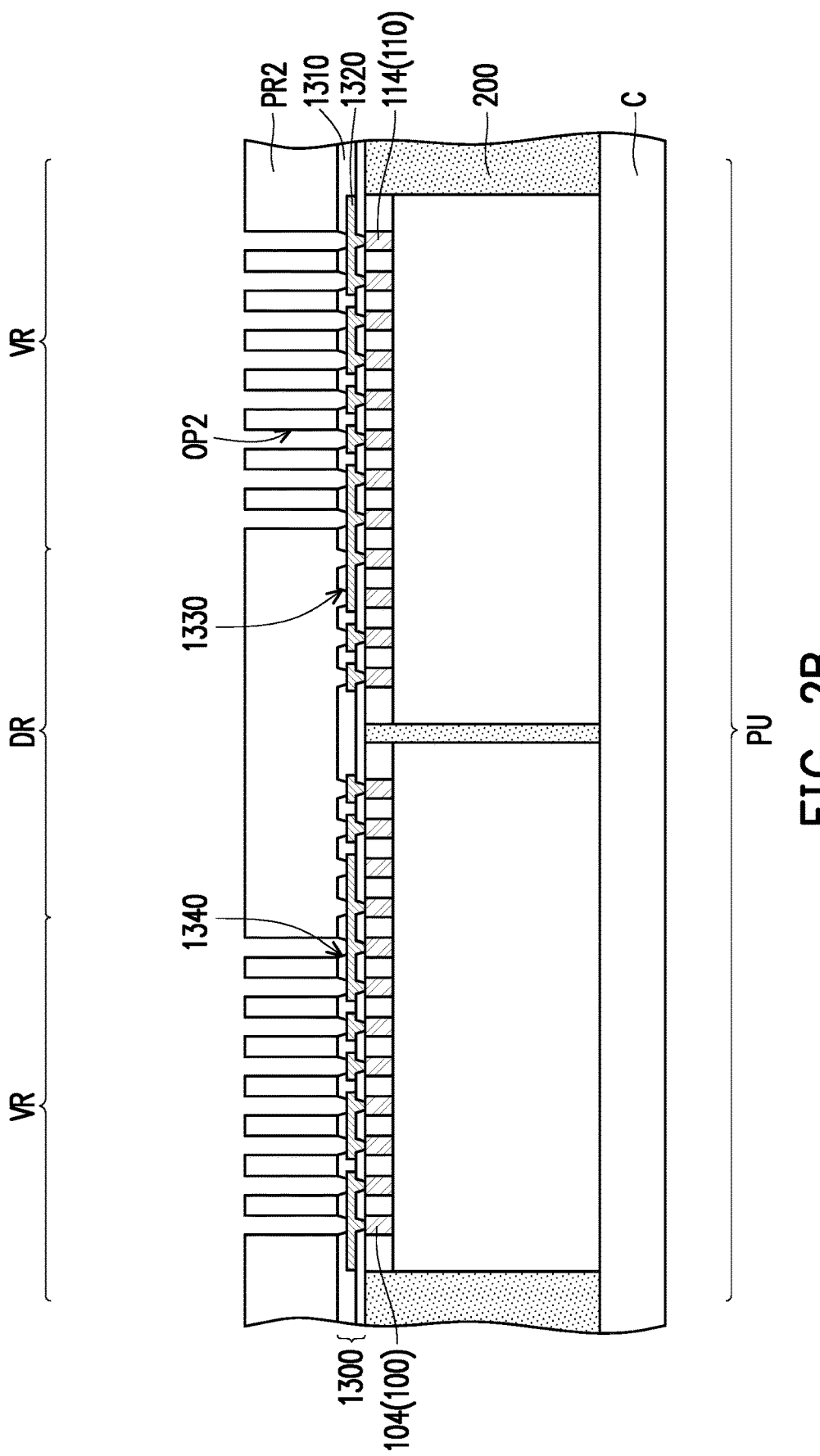
Figure 2C:
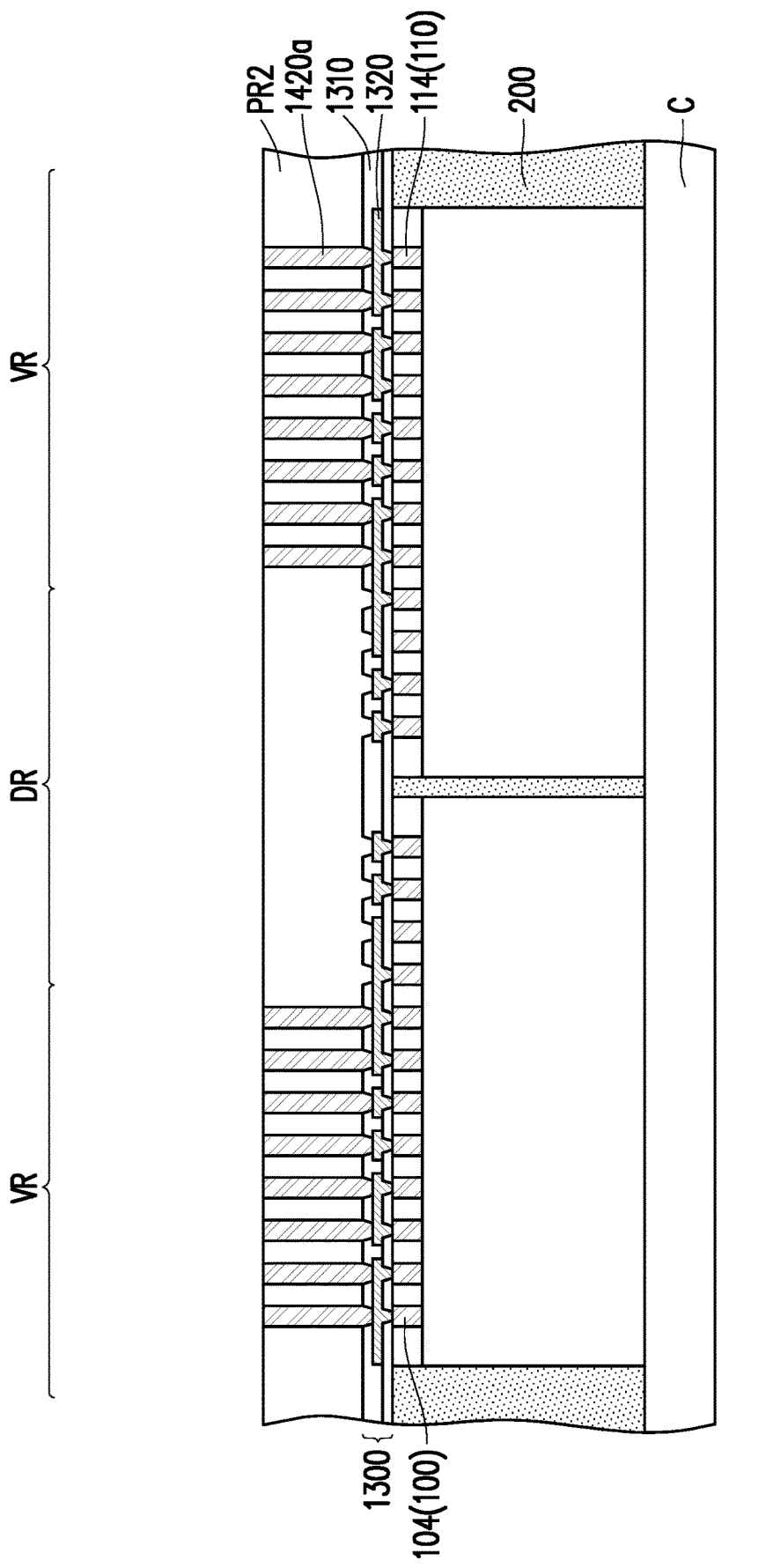
Figure 2D:
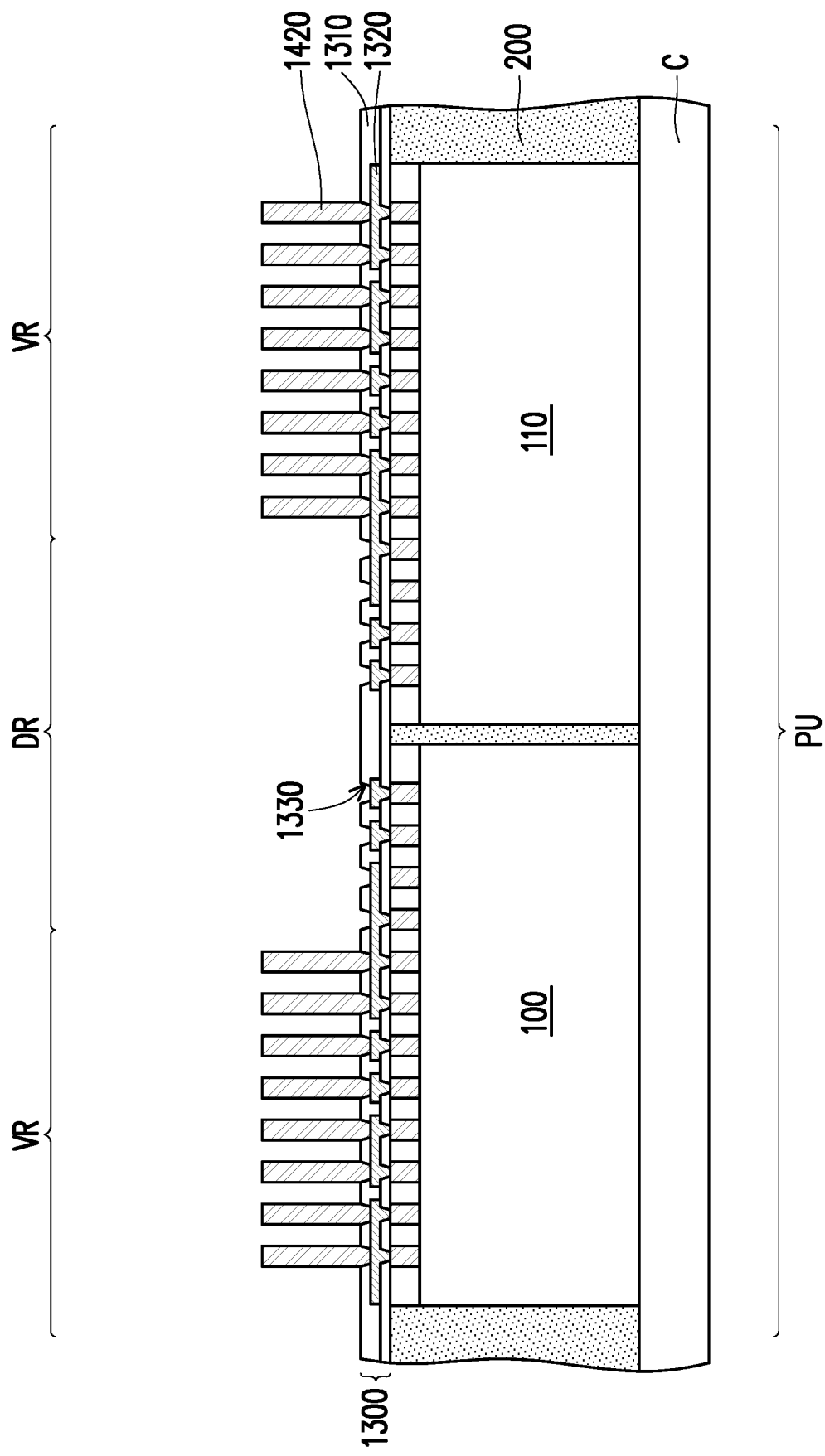
Figure 2E:
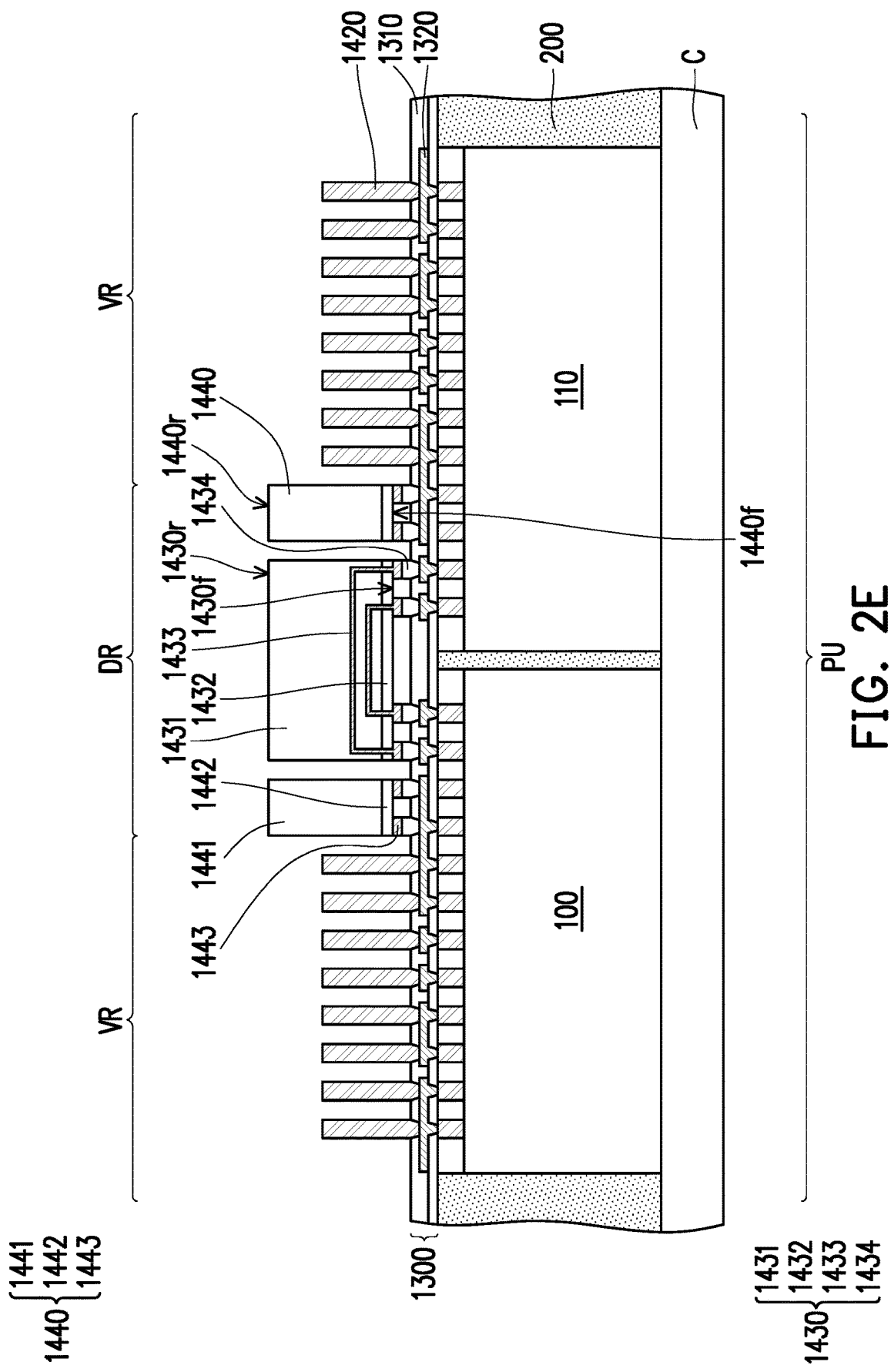
Figure 2F:
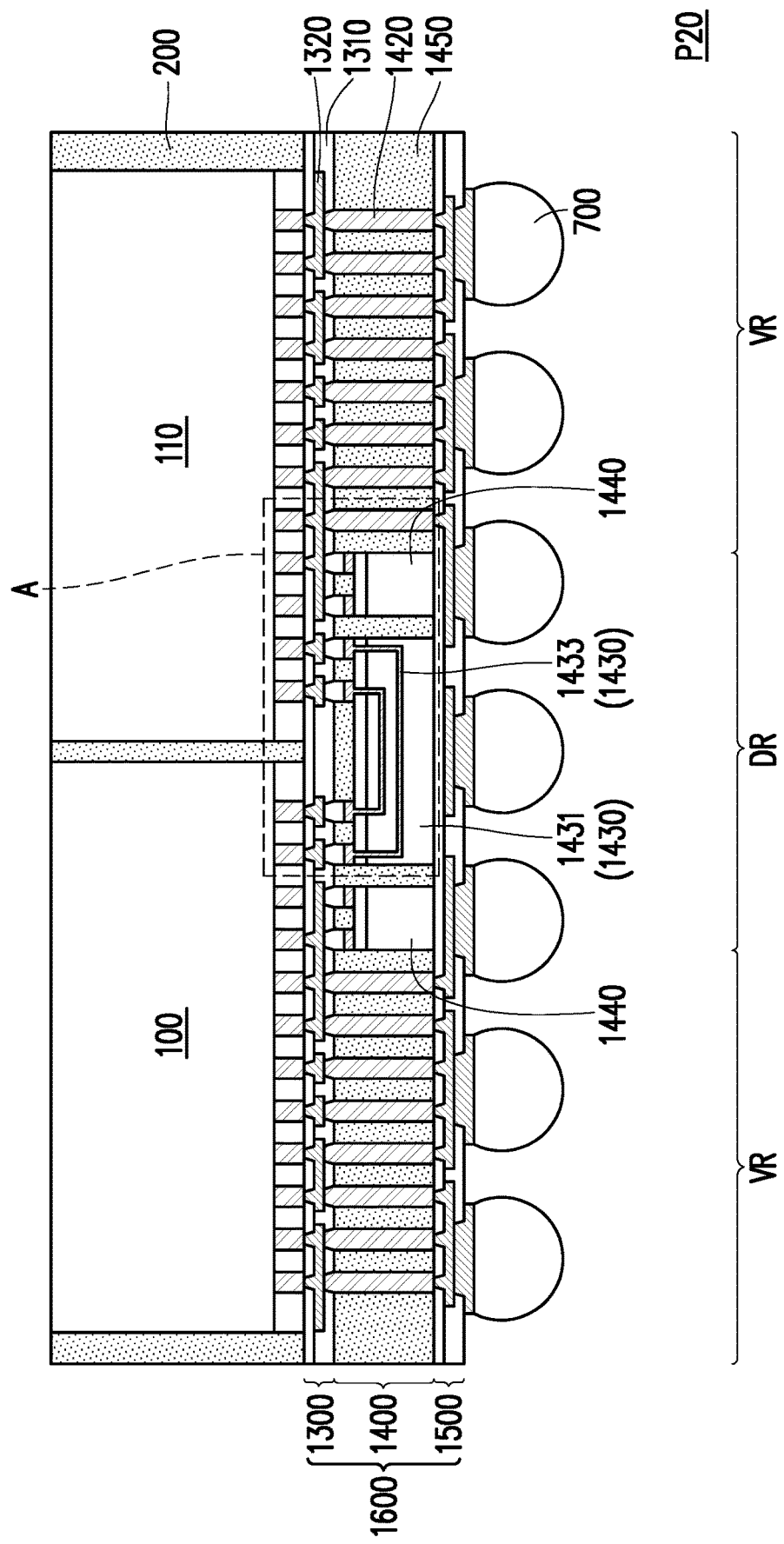

FIG. 2A through FIG. 2F are schematic cross-sectional views of structures formed during a manufacturing process of a semiconductor package P20 according to some embodiments of the disclosure. In some embodiments, the structure of FIG. 2A may be formed following similar steps as the ones previously described with reference to FIG. 1A through FIG. 1E, so that the process will only be briefly outlined here. In some embodiments, the semiconductor dies 100, 110 are disposed on the carrier C and encapsulated in the encapsulant 200, and the inner redistribution layer 1300 is formed on the semiconductor dies 100, 110 and the encapsulant 200. The inner redistribution layer 1300 includes the dielectric layers 1310 and one or more metallization tiers 1320 electrically connected to the contact pads 104, 114 of the semiconductor dies 100, 110. A difference with respect to the previous process is that the blanket photoresist layer BPR2 is laminated on the inner redistribution layer 1300 without forming the contact pads (e.g., the contact pads 410 of FIG. 1D). That is, the blanket photoresist layer BPR2 may fill the openings 1330 and 1340. Referring to FIG. 2A and FIG. 2B, the blanket photoresist layer BPR2 is patterned to form the photoresist layer PR2 including openings OP2 which expose the openings 1340 in the interconnect via region VR. Thereafter, as illustrated in FIG. 2C and FIG. 2D, the openings OP2 and 1340 are filled with the conductive material 1420a and the photoresist layer PR2 is stripped to expose again the inner redistribution layer 1300. The openings 1330 of the inner redistribution layer 1300 expose portions of the metallization tier 1320 in the device attach region DR. Similar to what was previously described, some of the openings 1330 overlay the semiconductor die 100 and some other openings 1330 overlay the semiconductor die 110. Referring to FIG. 2E, the semiconductor bridge 1430 and the integrated passive devices 1440 are disposed on the inner redistribution layer 1300 in between the TIVs 1420, with the corresponding front surfaces 1430f, 1440f directed towards the semiconductor dies 100, 110. A difference with respect to the process previously described is that the semiconductor bridge 1430 and the integrated passive devices 1440 are directly connected to the metallization tier 1320, without intervening contact pads 410 (illustrated, e.g., in FIG. 1I) formed therebetween. That is, the conductive terminals 1434 of the semiconductor bridge 1430 and the conductive terminals 443 of the integrated passive devices 440 directly contact the metallization tier 1320. After the semiconductor bridge 1430 and the integrated passive devices 1440 are bonded to the inner redistribution layer 1300, process steps similar to the ones described before with reference to FIG. 1J to FIG. 1M result in the formation of the semiconductor package P20 illustrated in FIG. 2F. In some embodiments, a difference between the semiconductor package P20 illustrated in FIG. 2F and the semiconductor package P10 illustrated in FIG. 1M lies in the absence of contact pads 410 in the bridging layer 1400. That is, the bridging layer 1400 of the redistribution structure 1600 of the semiconductor package P20 includes the TIVs 1420, the semiconductor bridge 1430, and the integrated passive devices 1440 encapsulated by the encapsulant 1450, with the semiconductor bridge and the integrated passive devices 1440 directly connected to the inner redistribution layer 1300. Other features may be common between the two semiconductor packages P10 and P20. It should be noted that for every embodiment disclosed in which the bridging layer does not include the contact pads like the contact pads 410 of FIG. 1D, there is a corresponding alternative embodiment in which such contact pads are included. For the sake of brevity, in the rest of the disclosure will be illustrated only structures in which the contact pads are not included in the bridging layer. Also, features not explicitly addressed of the semiconductor packages described hereafter may be considered to be similar to the features previously discussed for the semiconductor packages P10 and P20.

Figure 3A:
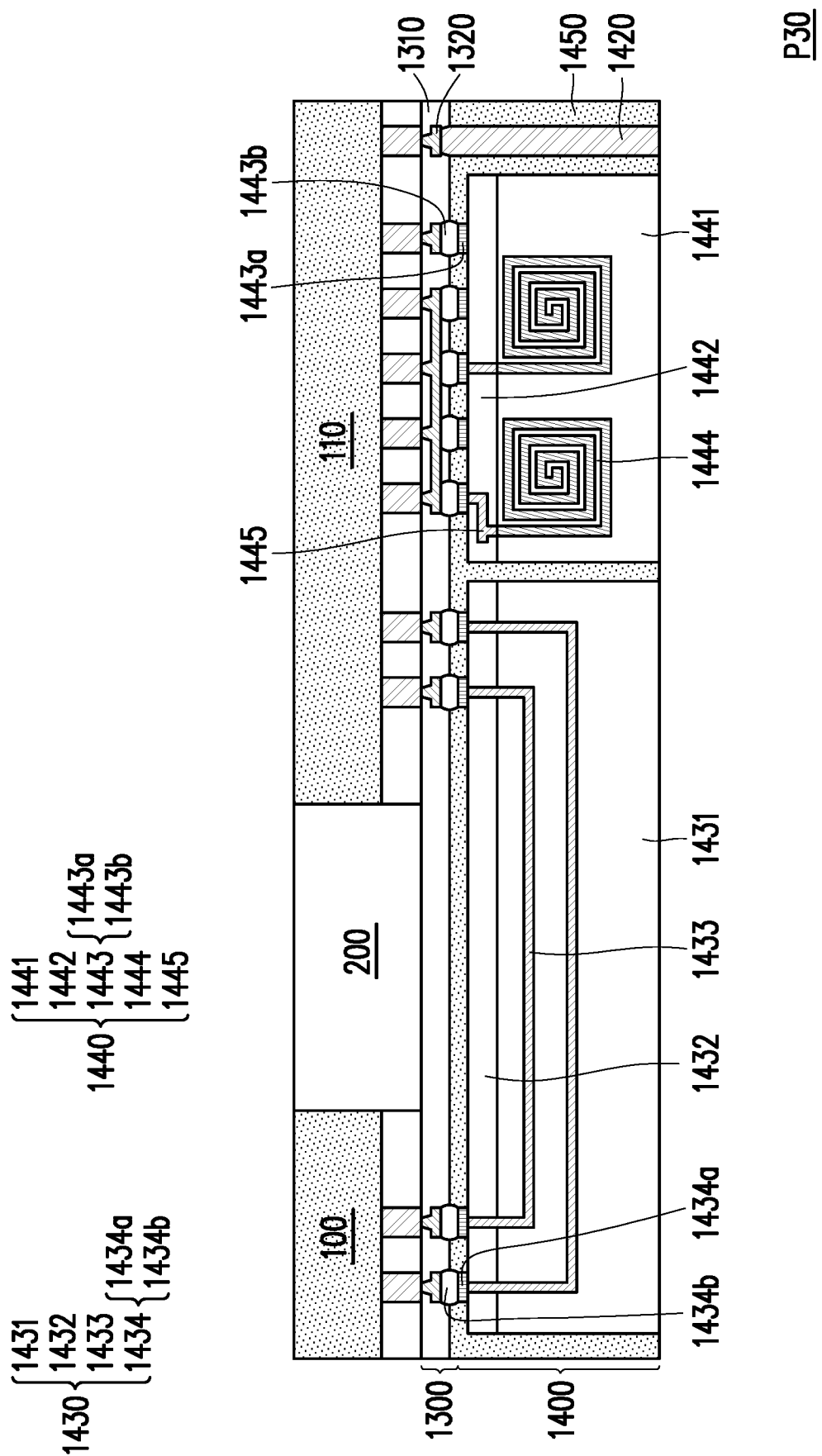
FIG. 3A to FIG. 3D are schematic cross-sectional views illustrating enlarged portions of semiconductor packages in accordance with some embodiments of the disclosure.

FIG. 3A through FIG. 3D are schematic cross-sectional views of enlarged portions of semiconductor packages according to some embodiments of the disclosure. The views of FIG. 3A through FIG. 3D may correspond to the area A illustrated in FIG. 2F. In FIG. 3A is illustrated an enlarged portion of a semiconductor package P30 according to some embodiments of the disclosure. In the semiconductor package P30, the semiconductor bridge 430 includes nested interconnection conductive patterns 1433 connected to the conductive terminals 1434 and interconnecting the semiconductor dies 100, 110. In some embodiments, one end of an interconnection conductive pattern 1433 is connected to a conductive terminal 1434 overlying and electrically connected to the semiconductor die 100, and the other end of the interconnection conductive pattern 1433 is connected to a conductive terminal 1434 overlying and electrically connected to the semiconductor die 110. In some embodiments, the integrated passive device 1440 illustrated in FIG. 3A overlays the semiconductor die 110, and includes passive device patterns 1444 (e.g., inductor patterns) formed in the semiconductor substrate 1441. In some embodiments, the passive device patterns 1444 are connected to the conductive terminals 1443 by conductive patterns 1445 extending through the dielectric layer 1442. In some embodiments, the integrated passive device 1440 overlying the semiconductor die 100 (illustrated, e.g., in FIG. 2F) may have a similar structure.

Figure 3B:
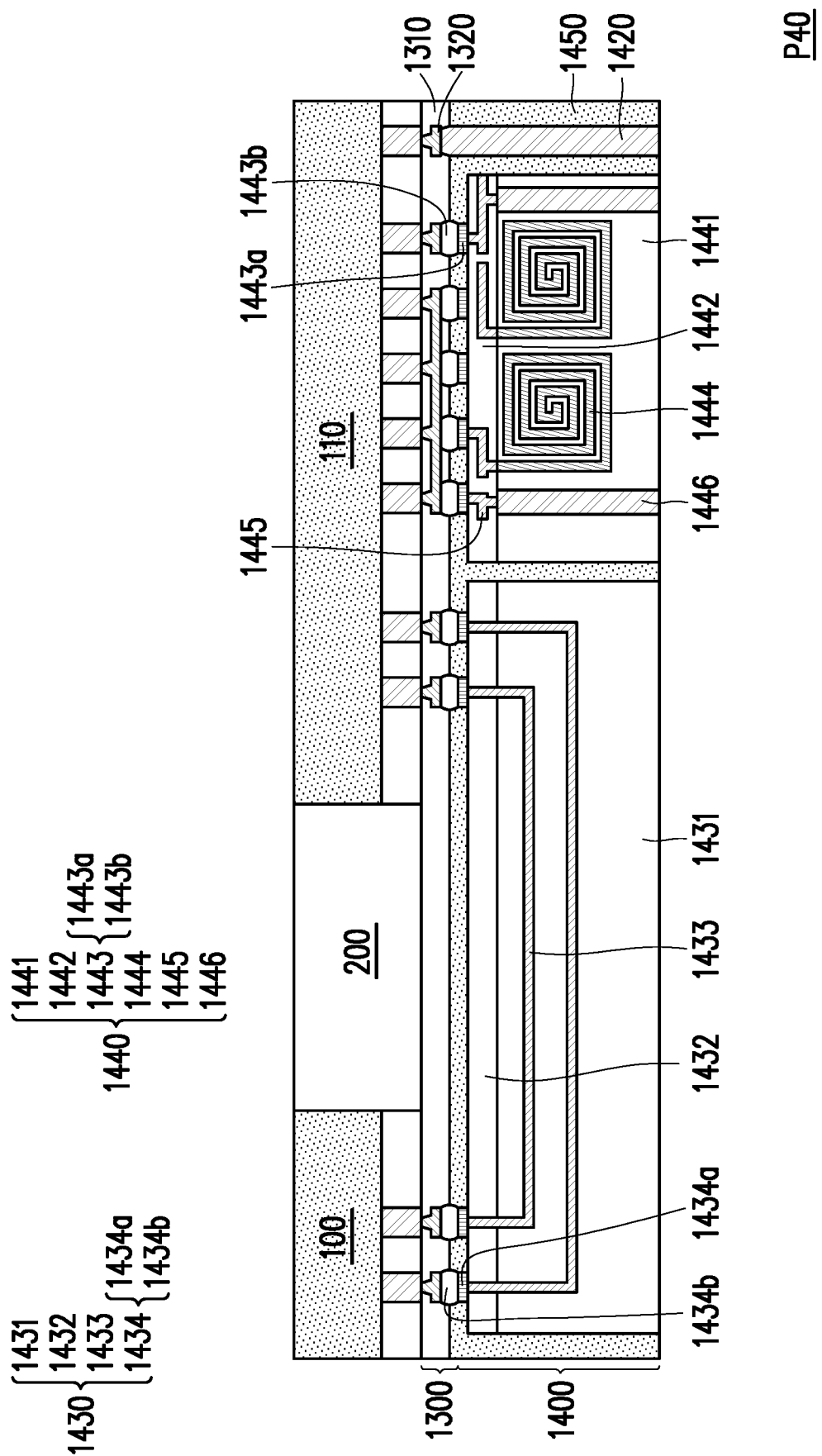

In FIG. 3B is illustrated an enlarged portion of a semiconductor package P40 according to some embodiments of the disclosure. A difference between the semiconductor package P40 and the semiconductor package P30 of FIG. 3A lies in the integrated passive device 1440 further including through semiconductor vias (TSVs) 1446 extending through the semiconductor substrate 1441 and establishing dual-side vertical connection between the front surface 1440f and the rear surface 1440r of the integrated passive device 1440. In some embodiments, one end of a TSV 1446 is connected (e.g., through intervening conductive patterns 1445) to a conductive terminal 1443, while the other end of the TSV 1446 is connected to the outer redistribution layer 1500 (illustrated, e.g., in FIG. 2F). In some embodiments, by including TSVs 1446 in the integrated passive devices 1440 it may be possible to minimize or avoid loss of I/O sites from the semiconductor dies 100, 110.

Figure 3C:
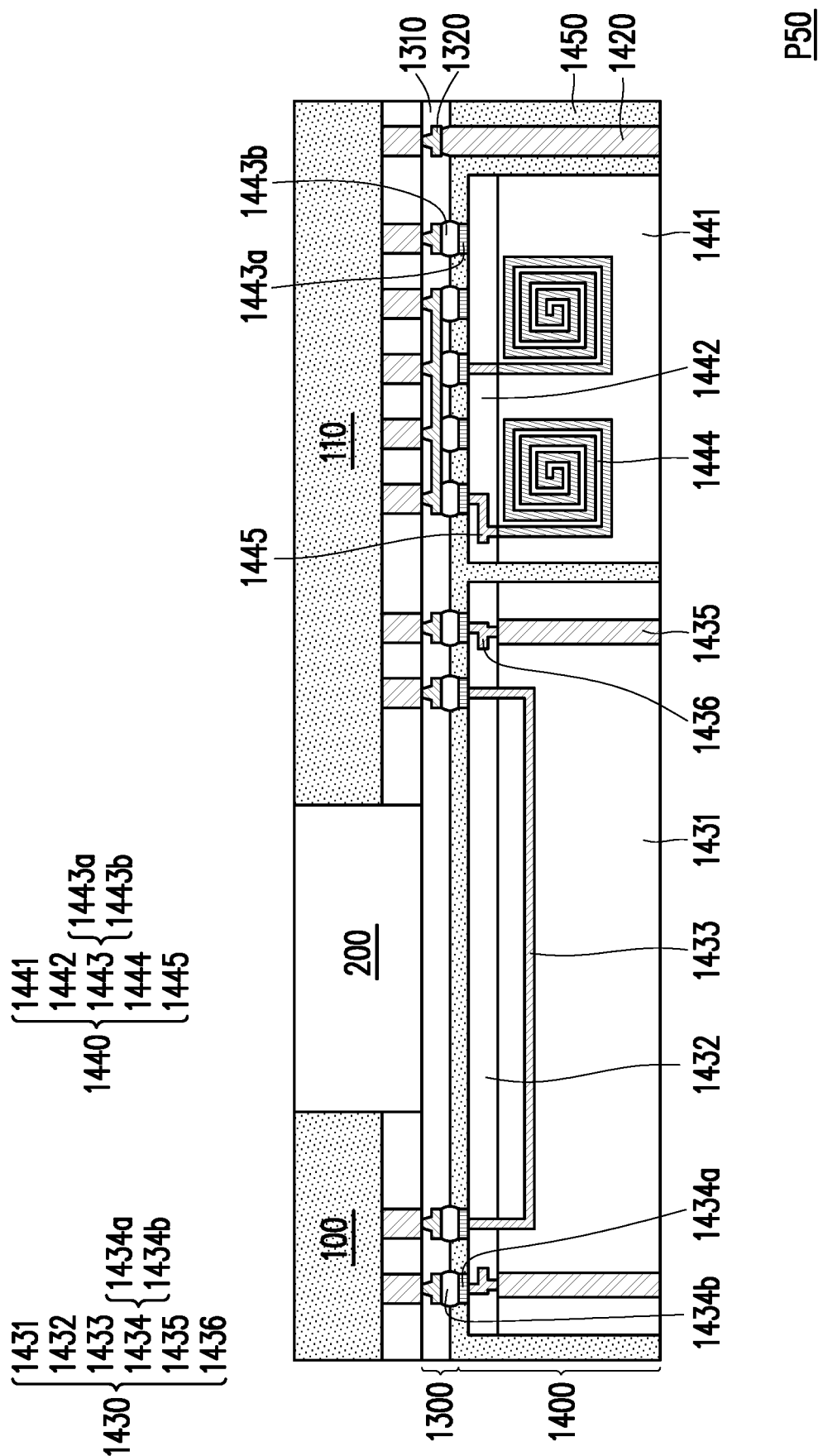

In FIG. 3C is illustrated an enlarged portion of a semiconductor package P50 according to some embodiments of the disclosure. A difference between the semiconductor package P50 and the semiconductor package P30 of FIG. 3A lies in the semiconductor bridge 1430 further including through semiconductor vias (TSVs) 1435 extending through the semiconductor substrate 1431 and establishing dual-side vertical connection between the front surface 1430f and the rear surface 1430r of the semiconductor bridge 1430. In some embodiments, one end of a TSV 1435 is connected (e.g., through intervening conductive patterns 1436) to a conductive terminal 1434, while the other end of the same TSV 1435 is connected to the outer redistribution layer 1500 (illustrated, e.g., in FIG. 2F). In some embodiments, by including TSVs 1435 in the semiconductor bridge 1430 it may be possible to minimize or avoid loss of I/O sites from the semiconductor dies 100, 110. In some embodiments, the conductive patterns 1436 may also establish electrical connection between the interconnection conductive patterns 1433 and the conductive terminals 1434.

Figure 3D:
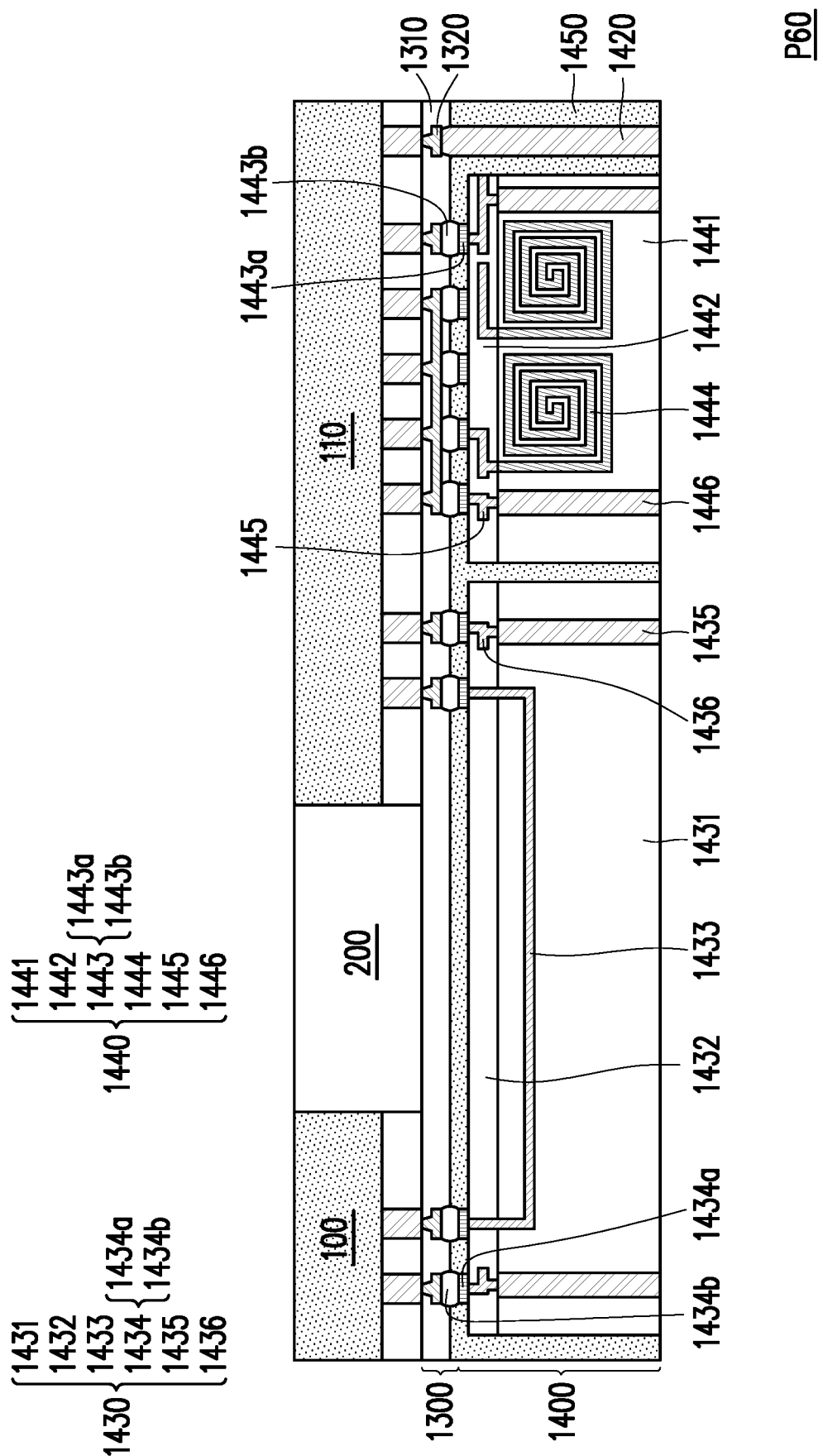

In FIG. 3D is illustrated an enlarged portion of a semiconductor package P60 according to some embodiments of the disclosure. A difference between the semiconductor package P60 and the semiconductor package P30 of FIG. 3A lies in that TSVs 1435, 1446 are formed both in the integrated passive devices 1440 and the semiconductor bridge 1430 (similar to what was discussed with reference to FIG. 3B and FIG. 3C). In some embodiments, by including TSVs 1435, 1446 in both of the semiconductor bridge 1430 and the integrated passive devices 1440 it may be possible to further minimize or avoid loss of I/O sites from the semiconductor dies 100, 110.

Figure 4A:
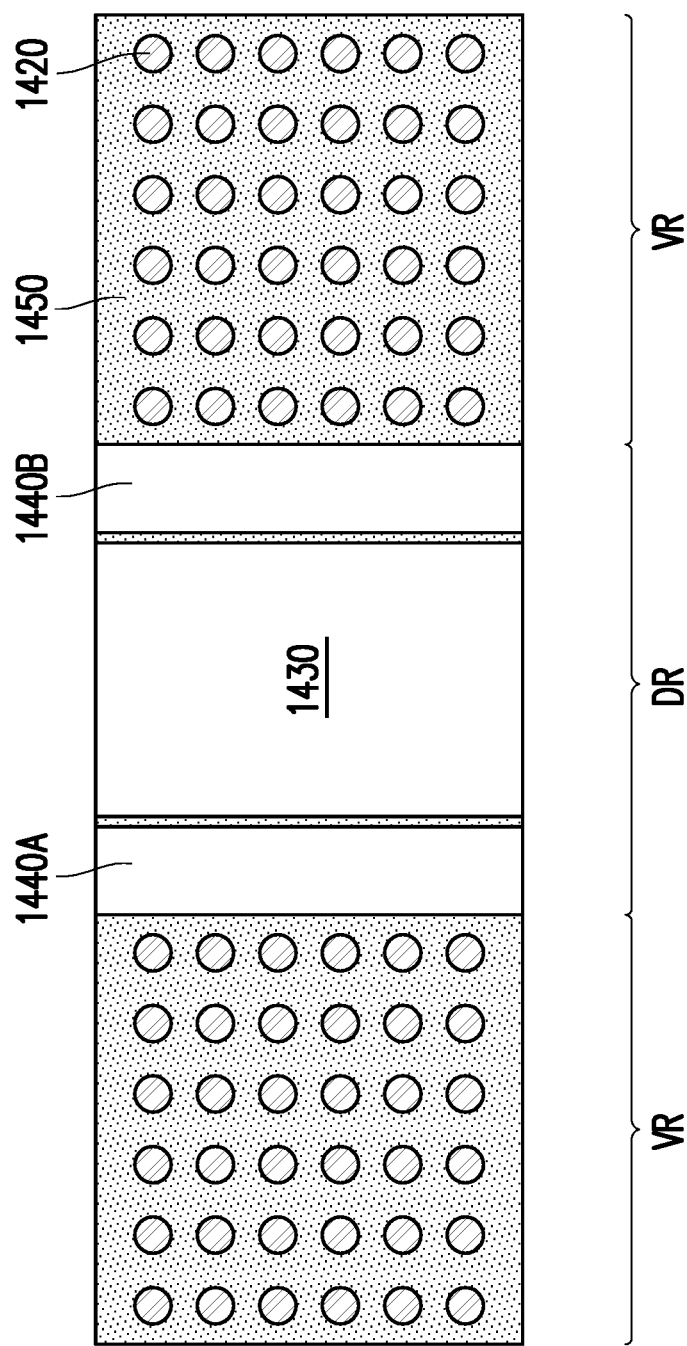
FIG. 4A to FIG. 4C are schematic cross-sectional views of semiconductor packages in accordance with some embodiments of the disclosure.
Figure 4B:
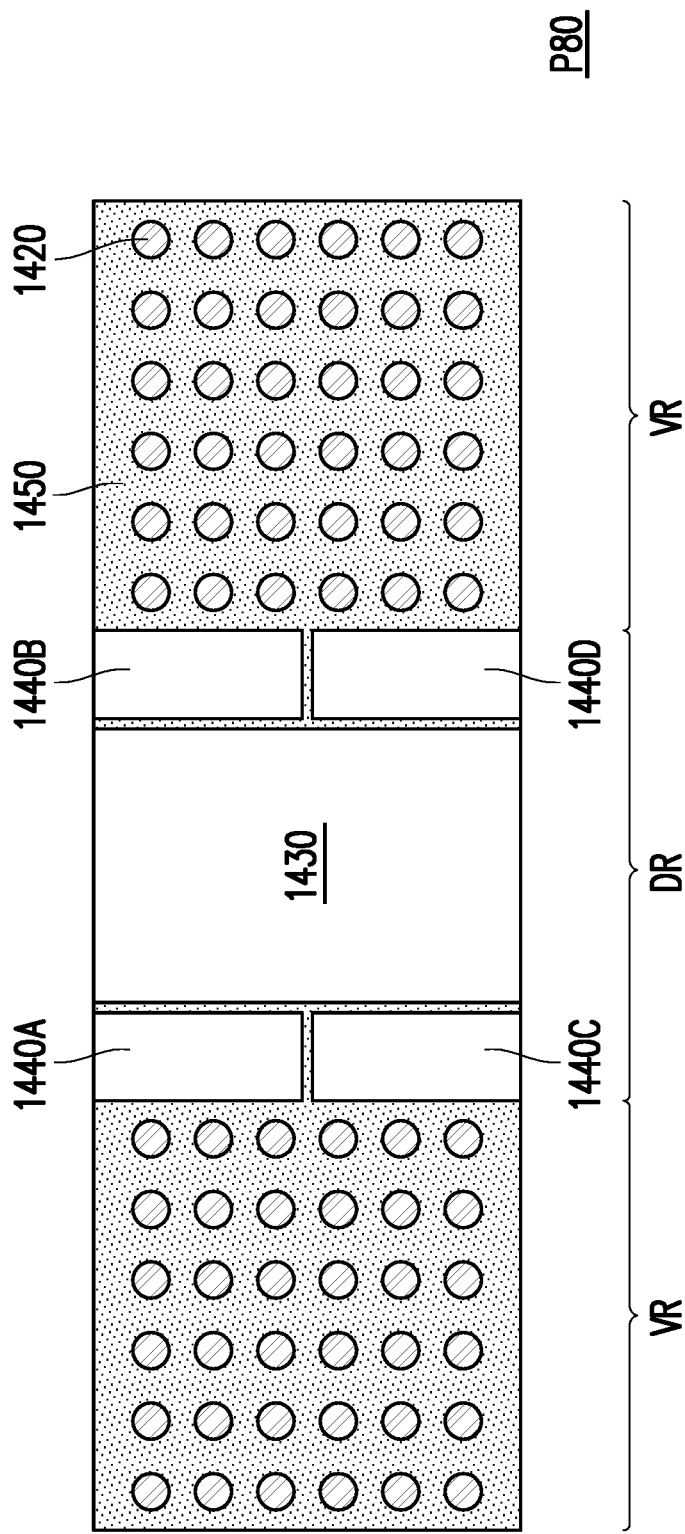
Figure 4C:
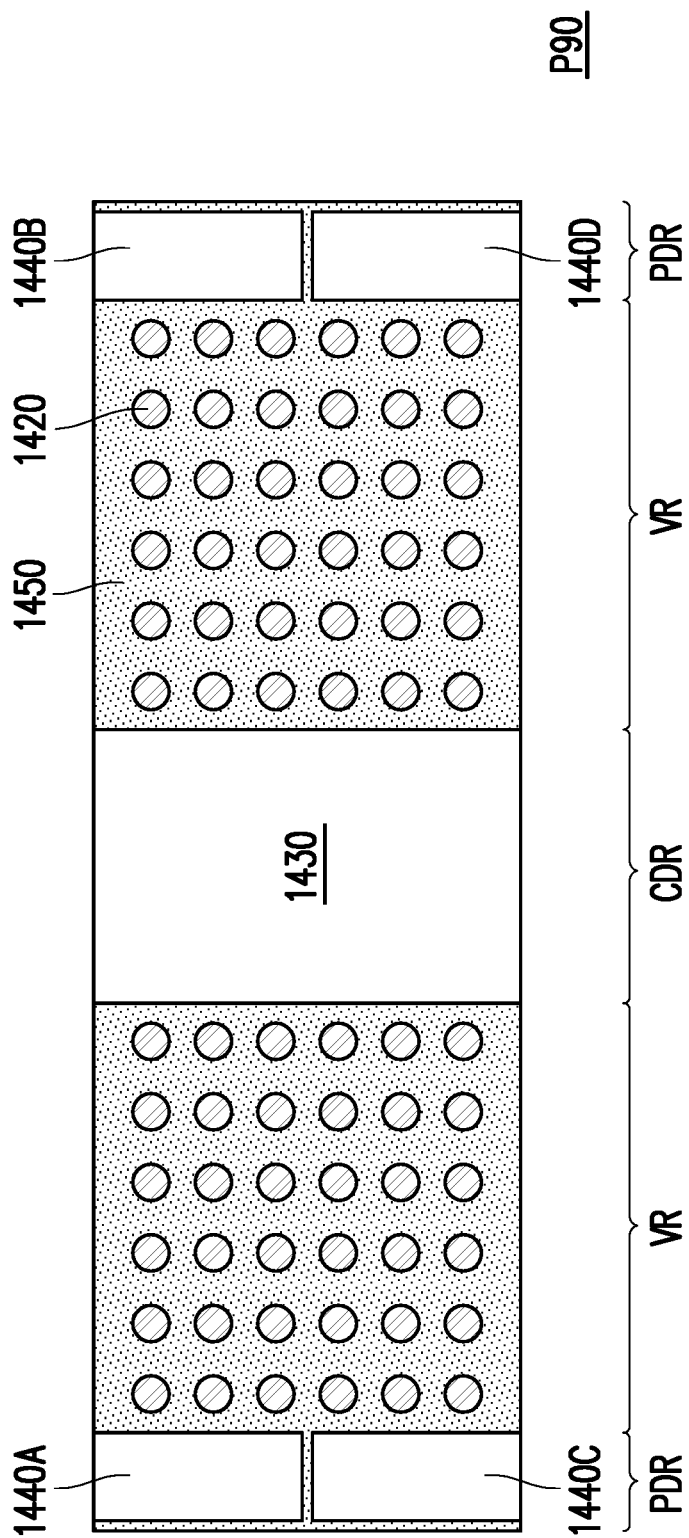

In FIG. 4A through FIG. 4C are illustrated schematic cross-sectional views of semiconductor packages according to some embodiments of the disclosure. The schematic cross-sectional views of FIG. 4A through FIG. 4C may be taken in a plane perpendicular with respect to the view illustrated, e.g., in FIG. 2F, at a level height corresponding to the line I-I of FIG. 2F. That is, the schematic cross-sectional views of FIG. 4A through FIG. 4C may be taken in planes passing through the bridging layer 1400 illustrated in FIG. 2F.

In FIG. 4A is illustrated a schematic cross-sectional view of a semiconductor package P70 according to some embodiments of the disclosure. In some embodiments, the semiconductor package P70 includes a device attach region DR and two interconnect via regions VR disposed at opposite sides of the device attach region DR. The semiconductor bridge 1430 is disposed towards the center of the device attach region DR (and of the semiconductor package P70), with a first integrated passive device 1440A on one side and a second integrated passive device 1440B on an opposite side. An interconnect via region VR may extend from the integrated passive device 1440A towards the edge of the semiconductor package P70, and the other interconnect via region VR may extend from the other integrated passive device 1440B towards the opposite edge of the semiconductor package P70.

In FIG. 4B is illustrated a schematic cross-sectional view of a semiconductor package P80 according to some embodiments of the disclosure. A difference between the semiconductor package P80 and the semiconductor package P70 of FIG. 4A lies in the number of integrated passive devices 1440A-D included. That is, in the semiconductor package P80, two integrated passive devices 1440A, 1440C are disposed on one side of the semiconductor bridge 1430, and other two integrated passive devices 1440B, 1440D are disposed on the opposite side of the semiconductor bridge 1430. Of course, the disclosure is not limited by the number of integrated passive devices 1440 included. In some alternative embodiments, more or fewer integrated passive devices 1440 may be included according to design and production requirements. In some embodiments, disposing the integrated passive devices 1440 closer to the semiconductor bridge 1430 (as illustrated, e.g., in FIG. 4A or FIG. 4B) may save routing area, increasing the number of available I/O sites.

In FIG. 4C is illustrated a schematic cross-sectional view of a semiconductor package P90 according to some embodiments of the disclosure. A difference between the semiconductor package P90 and the semiconductor package P80 of FIG. 4B lies in the fact that the TIVs 1420 are disposed in between the semiconductor bridge 1430 and the integrated passive devices 1440A-D. That is, the semiconductor package P90 includes a central device attach region CDR in which the semiconductor bridge 1430 is disposed, and two peripheral device attach regions PDR in which the integrated passive devices 1440A-D are disposed. The peripheral device attach regions PDR are disposed at opposite sides of the central device attach region CDR, and are separated from the central device attach region CDR by the interconnect via regions VR. That is, while in the semiconductor package P70 or P80 of FIG. 4A or FIG. 4B the integrated passive devices 1440 are disposed in between the semiconductor bridge 1430 and the TIVs 1420, in the semiconductor package P90 the TIVs 1420 are disposed in between the semiconductor bridge 1430 and the integrated passive devices 1440. However, the disclosure is not limited thereto. In some alternative embodiments, the integrated passive devices 1440 may be included also in the central device attach region CDR as well as in the peripheral device attach regions PDR.

Figure 5:
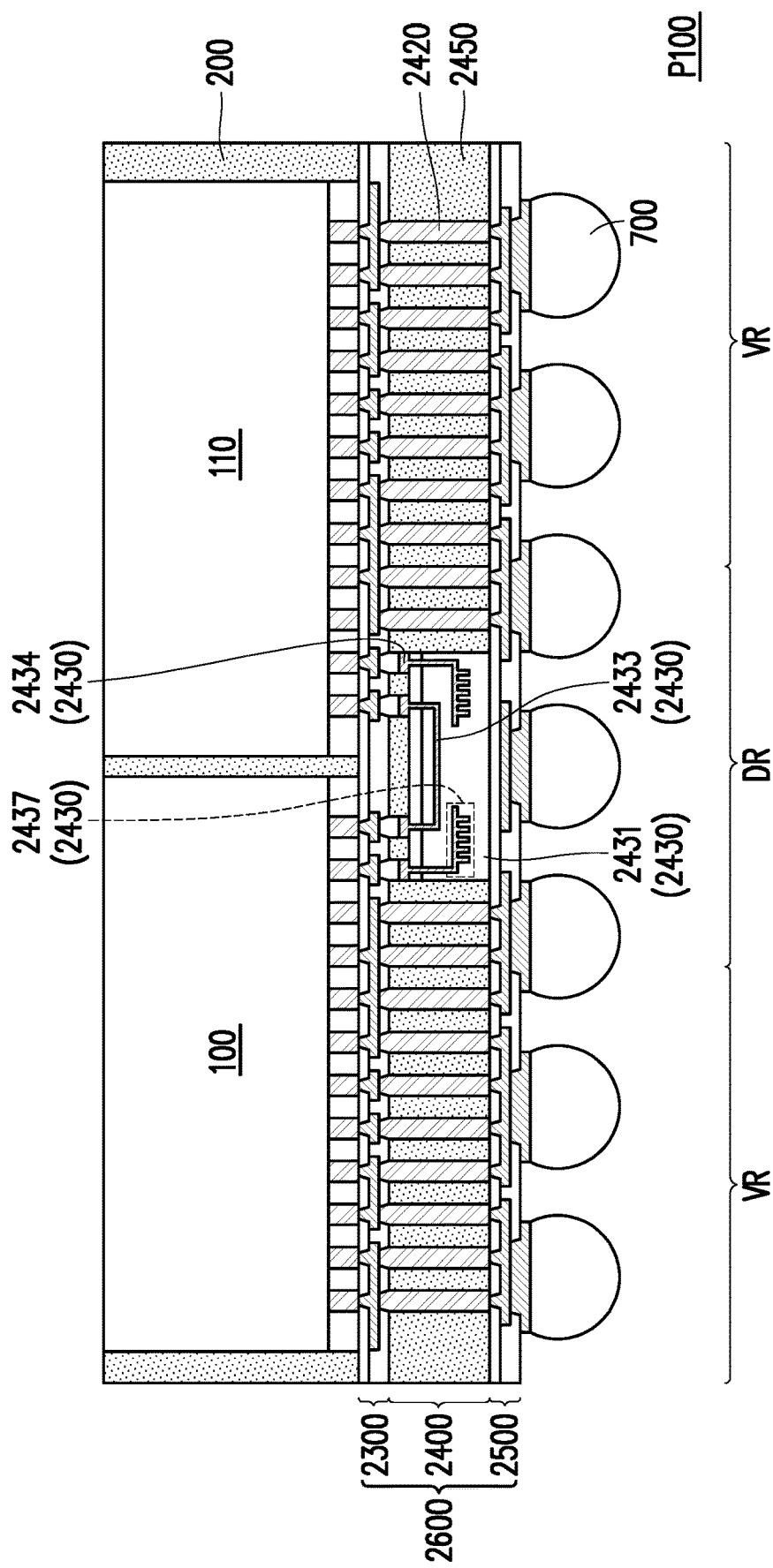
FIG. 5 through FIG. 7 are schematic cross-sectional views illustrating semiconductor packages in accordance with some embodiments of the disclosure.

FIG. 5 is a schematic cross-sectional view of a semiconductor package P100 according to some embodiments of the disclosure. A difference between the semiconductor package P100 and the semiconductor package P20 of FIG. 2F lies in the integrated passive devices being formed within the semiconductor bridge 2430. That is, in the semiconductor package P100, the bridging layer 2400 of the redistribution structure 2600 may not include separate integrated passive devices (e.g., the integrated passive devices 1440 illustrated in FIG. 2F). Rather, passive devices patterns 2437 (e.g., the deep trench capacitors, inductors, etc.) are formed in the semiconductor substrate 2431 of the semiconductor bridge 2430 beside the interconnection conductive patterns 2433 interconnecting the semiconductor dies 100, 110. The passive device patterns 2437 may be electrically connected to the semiconductor dies 100, 110 through some dedicated conductive terminals 2434 of the semiconductor bridge 2430. In some embodiments, the integrated passive devices may be formed at opposite sides of the interconnection conductive patterns 2433. For example, a first passive device pattern 2437 may be formed on one side of the interconnection conductive patterns 2433 to overlay and be connected with the semiconductor die 100, and another first device pattern 2437 may be formed on an opposite side of the interconnection conductive patterns 2433 to overlay and be connected with the semiconductor die 110.

Figure 6:
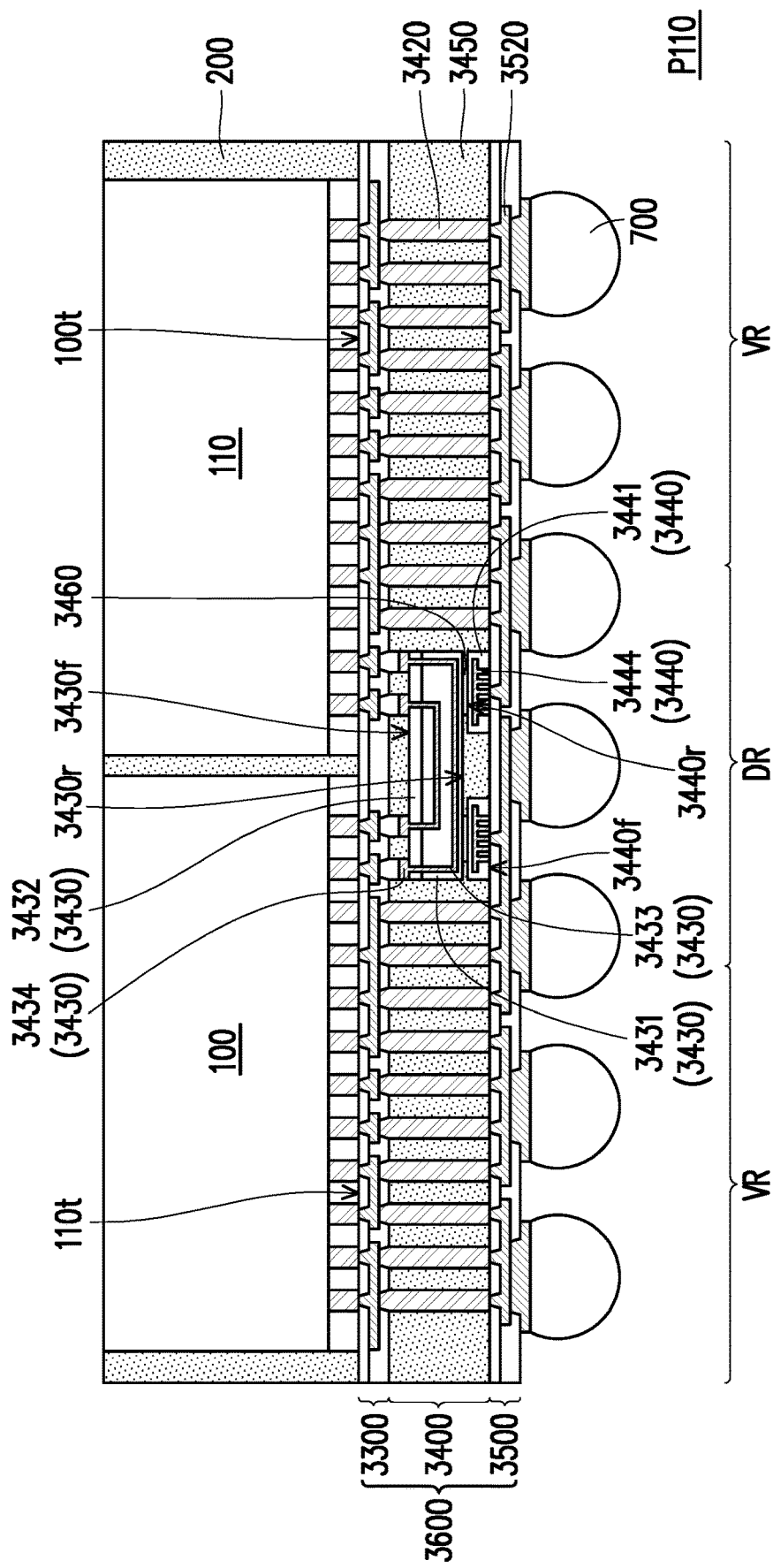

FIG. 6 is a schematic cross-sectional view of a semiconductor package P110 according to some embodiments of the disclosure. A difference between the semiconductor package P110 and the semiconductor package P20 of FIG. 2F lies in position and orientation of the integrated passive devices 3440 within the bridging layer 3400 of the redistribution structure 3600. In some embodiments, the integrated passive devices 3440 are stacked on the semiconductor bridge 3430 rather than being disposed side by side with respect to the semiconductor bridge 3430 (as illustrated, for example, in FIG. 2F). That is, the semiconductor bridge 3430 may be disposed between the integrated passive devices 3440 and the inner redistribution layer 3300, and the integrated passive devices 3440 may be disposed between the semiconductor bridge 3430 and the outer redistribution layer 3500. The integrated passive devices 3440 and the semiconductor bridge 3430 may be disposed in a back-to-back configuration. That is, the rear surfaces 3440*r* of the integrated passive devices 3440 may be directed towards the rear surface 3430*r* of the semiconductor bridge 3430 (and the top surfaces 100*t*, 110*t* of the semiconductor dies 100, 110). The front surface 3430*f* of the semiconductor bridge 3430 (the contact surface) is directed towards the inner redistribution layer 3300, so that the semiconductor bridge 3430 is directly connected to the inner redistribution layer 3300, and the front surfaces 3440*f* of the integrated passive devices 3440 (the contact surfaces) are directed towards the outer redistribution layer 3500, so that the integrated passive devices 3440 are directly connected to the outer redistribution layer 3500. The integrated passive devices 3440 may be connected to the semiconductor dies 100, 110 via (in order) the outer redistribution layer 3500, the TIVs 3420 and the inner redistribution layer 3300. In some embodiments, the integrated passive devices 3440 may be secured to the semiconductor bridge 3430 via portions of die attach film 3460. For example, strips of die attach film 3460 may be disposed in between the rear surface 3430*r* of the semiconductor bridge and the rear surfaces 3440*r* of the integrated passive devices 3440. Portions of the encapsulant 3450 may extend in between the integrated passive devices 3440 over the semiconductor bridge 3430. That is, the encapsulant 3450 may separate the semiconductor bridge 3430 from the outer redistribution layer 3500.

Figure 7:
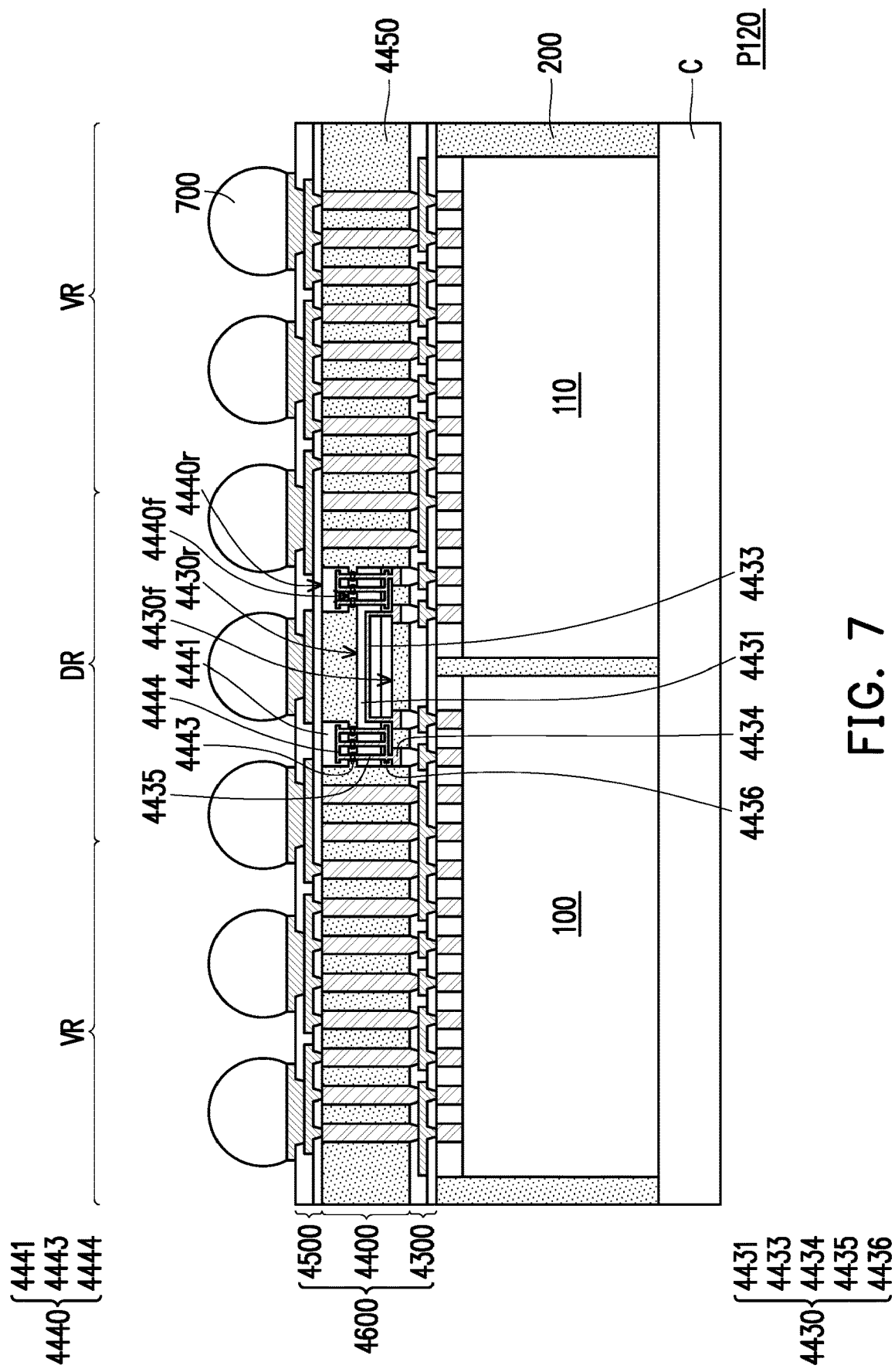

FIG. 7 is a schematic cross-sectional view of a semiconductor package P120 according to some embodiments of the disclosure. A difference between the semiconductor package P120 and the semiconductor package P110 of FIG. 6 lies in the configuration of the integrated passive devices 4440 with respect to the semiconductor bridge 4430. That is, in the semiconductor package P120, the integrated passive devices 4440 are disposed in a face-to-back configuration with respect to the semiconductor bridge 4430, with the respective front surfaces 4440*f* directed towards the rear surface 4430*r* of the semiconductor bridge 4430. As such, the rear surfaces 4440*r* of the integrated passive devices 4440 are directed towards the outer redistribution layer 4500. In the semiconductor package P120, the integrated passive devices 4440 may be connected to the semiconductor dies 100, 110 through the semiconductor bridge 4430. For example, the semiconductor bridge 4430 includes through semiconductor vias (TSVs) 4435 and conductive patterns 4436 establishing dual-side vertical electrical connection between the front surface 4430*f* and the rear surface 4430*r*. The passive device patterns 4444 formed in the integrated passive devices 4440 may be connected to the TSVs 4435 either directly, or through intervening conductive terminals 4443. As such, the integrated passive devices 4440 may be connected to the semiconductor dies 100, 110 via the semiconductor bridge 4430 and the inner redistribution layer 4300.

Figure 8A:
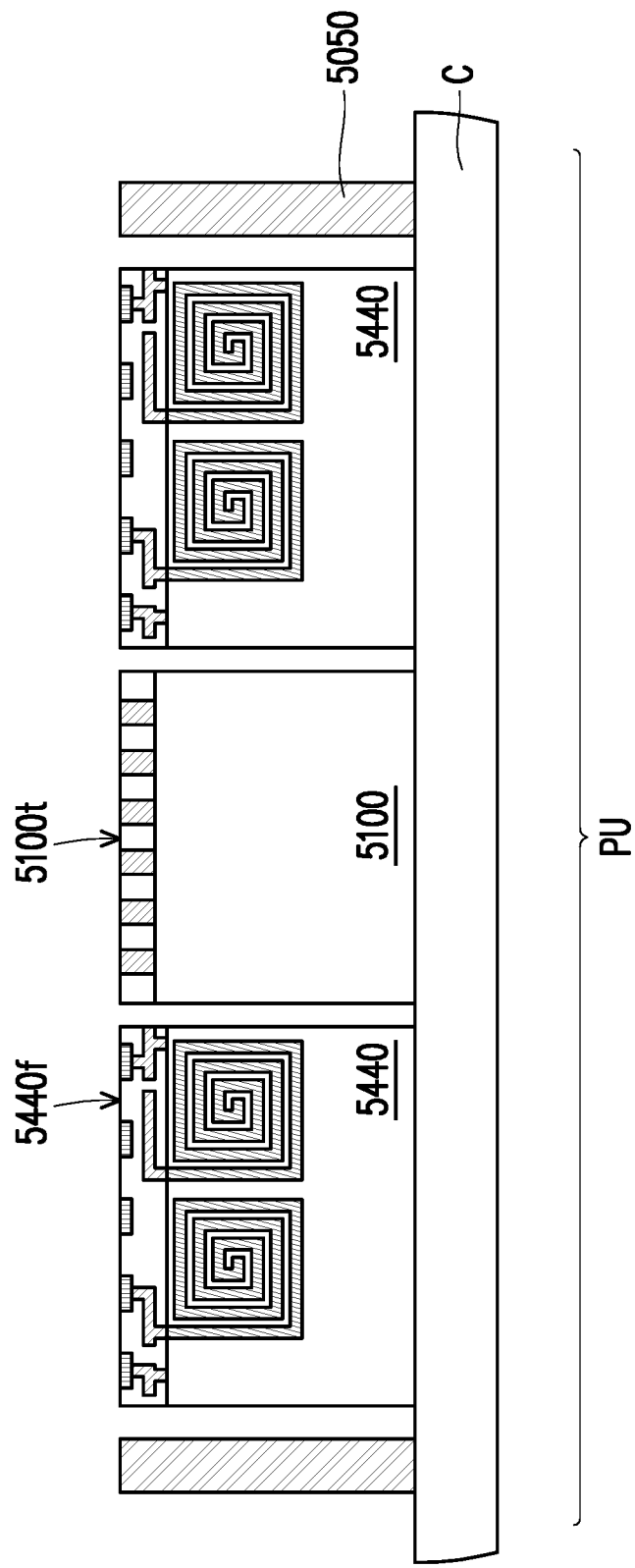
FIG. 8A through FIG. 8C are schematic cross-sectional views illustrating structures produced during a manufacturing process of a semiconductor package in accordance with some embodiments of the disclosure.
Figure 8B:
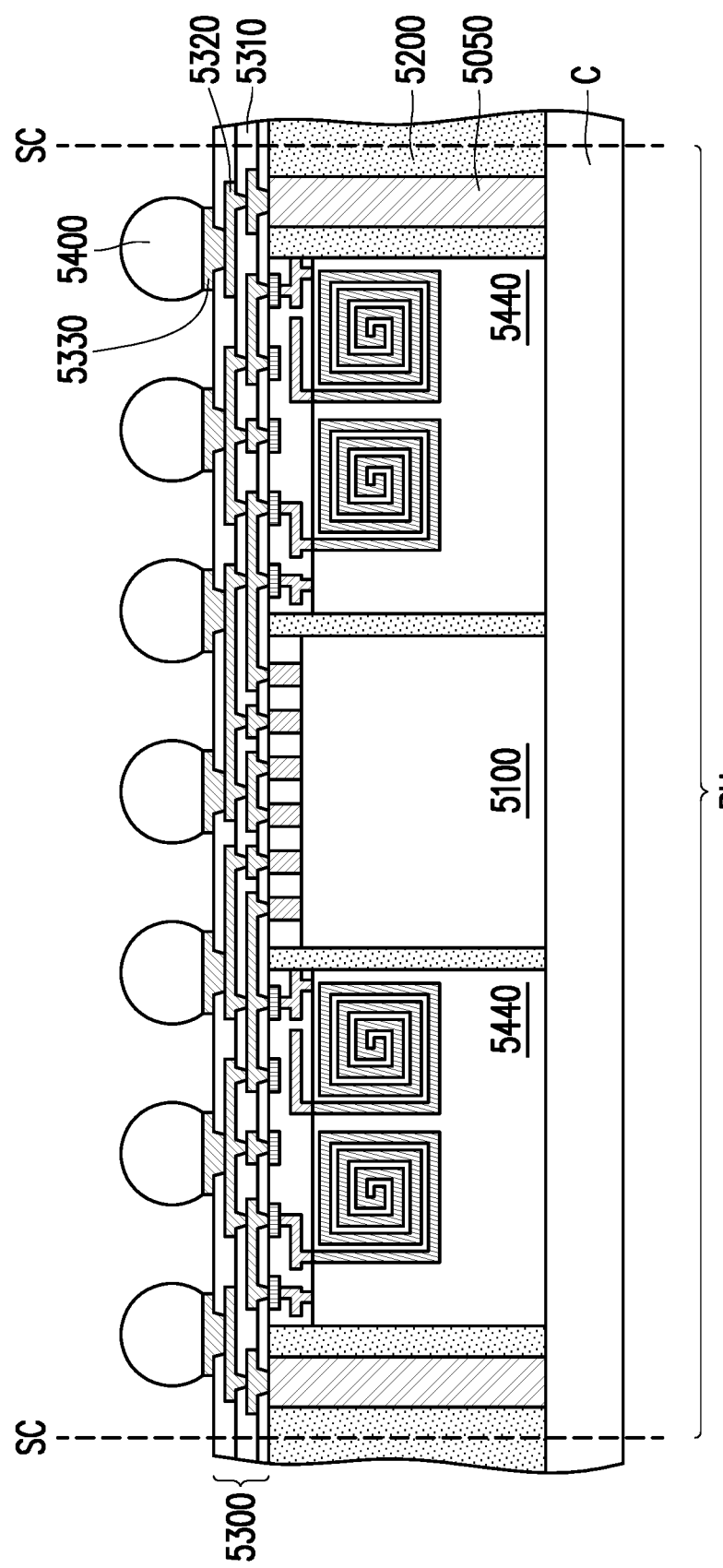
Figure 8C:
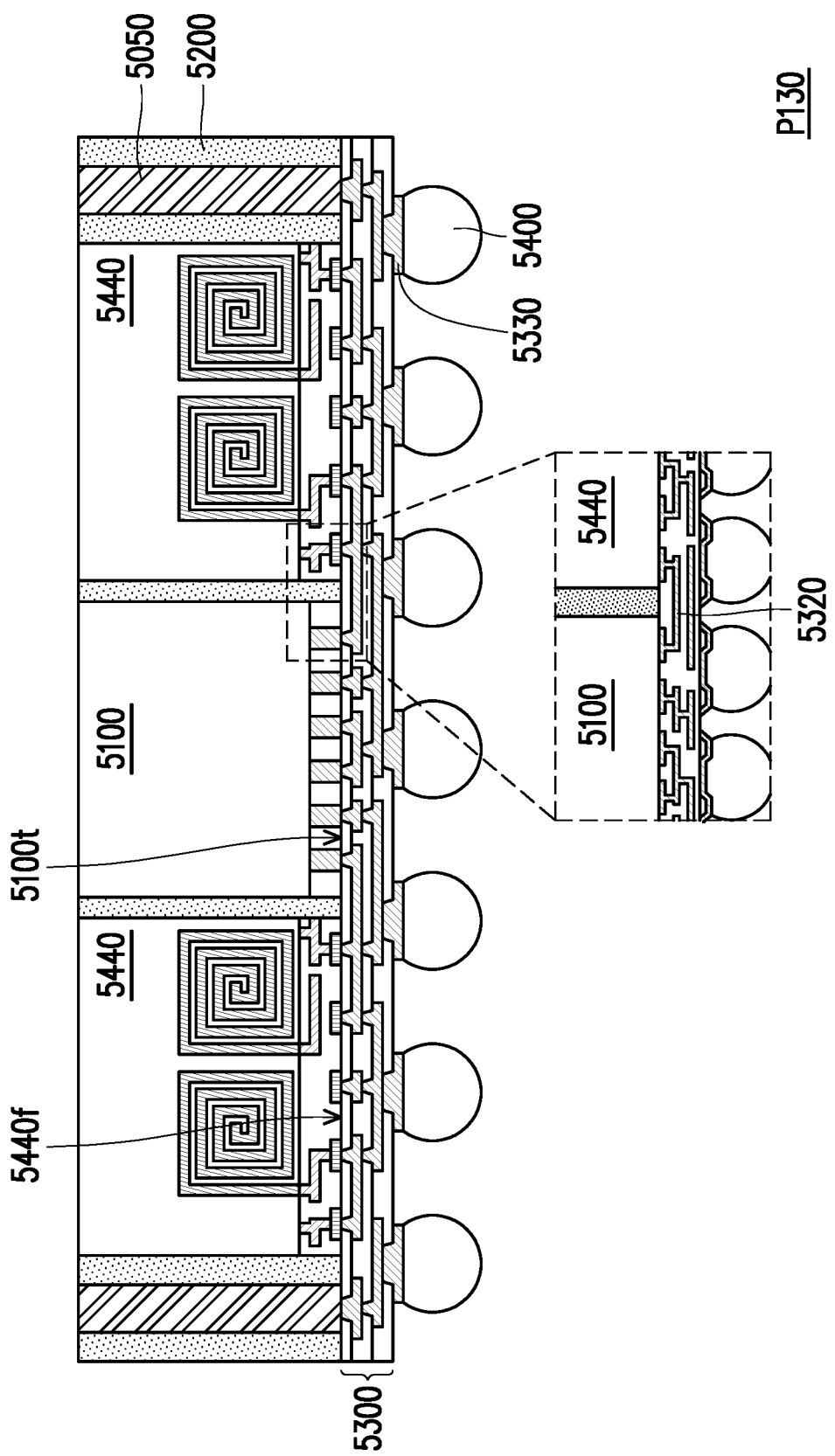

FIG. 8A through FIG. 8C are schematic cross-sectional views of structures formed during a manufacturing process of a semiconductor package P130 according to some embodiments of the disclosure. Referring to FIG. 8A, TIVs 5050, semiconductor dies 5100, and integrated passive devices 5440 are provided over the carrier C. In some embodiments, the order of providing the TIVs 5050, the semiconductor dies 5100 and the integrated passive devices 5440 may be selected according to process requirements. The TIVs 5050 may be provided, for example, through a photolithography process, a plating process, a photoresist stripping process, and/or any other suitable process. In some embodiments, the TIVs 5050 may be pre-fabricated conductive pillars which are picked and placed over the carrier C. The semiconductor dies 5100 and the integrated passive devices 5440 are respectively similar to the semiconductor dies 100, 110 and the integrated passive devices 440 (illustrated, e.g., illustrated in FIG. 1I), and a detailed description thereof is omitted. The semiconductor dies 5100 and the integrated passive devices 5440 may be disposed on the carrier C through a pick-and-place process, for example. In some embodiments, the semiconductor dies 5100 and the integrated passive devices 5440 are disposed in between the TIVs 5050 in a face-up configuration, with the respective top surfaces 5100t and front surfaces 5440f (contact surfaces) facing away from the carrier C.

Referring to FIG. 8B and FIG. 8C, the TIVs 5050, the semiconductor dies 5100, and the integrated passive devices 5440 are molded in the encapsulant 5200, and the redistribution structure 5300 and the connective terminals 5400 are subsequently provided thereon. The encapsulant 5200 may be produced employing similar materials and following similar processes as the encapsulant 200 (illustrated, e.g., in FIG. 1B). The redistribution structure 5300 may be produced following similar steps as previously described with respect to the redistribution layers 300 and 500 (illustrated, e.g., in FIG. 1L). The redistribution structure 5300 includes a single redistribution layer including the dielectric layers 5310, one or more metallization tiers 5320, and, optionally, the under-bump metallurgies 5330 disposed in contact with the (outermost) metallization tier 5320.

In some embodiments, the semiconductor package P130 may be provided after singulation and removal of the carrier C. As illustrated in FIG. 8C, a difference between the semiconductor package P130 and the semiconductor package P20 of FIG. 2F lies in the position of the integrated passive devices 5440. That is, in the semiconductor package P130, the integrated passive devices 5440 are embedded in the encapsulant 5200 beside the semiconductor die(s) 5100, rather than in a bridging layer of the redistribution structure 5300. More specifically, the integrated passive devices 5440 are disposed at the sides of the semiconductor die(s) 5100, with the respective front surfaces 5440f and top surface(s) 5100t (contact surfaces) being substantially coplanar. In some embodiments, the semiconductor package P130 does not include a semiconductor bridge, and the redistribution structure 5300 does not include a bridging layer. Rather, as illustrated in the inset of FIG. 8C, the semiconductor die(s) 5100 may be connected with each other or with the integrated passive devices 5440 by conductive patterns of some metallization tiers 5320 of the redistribution structure 5300. By doing so, in some embodiments, the connection between the integrated passive devices 5440 and the semiconductor die(s) 5100 may be shortened, thus increasing the efficiency of the semiconductor package P130.

Figure 8D:
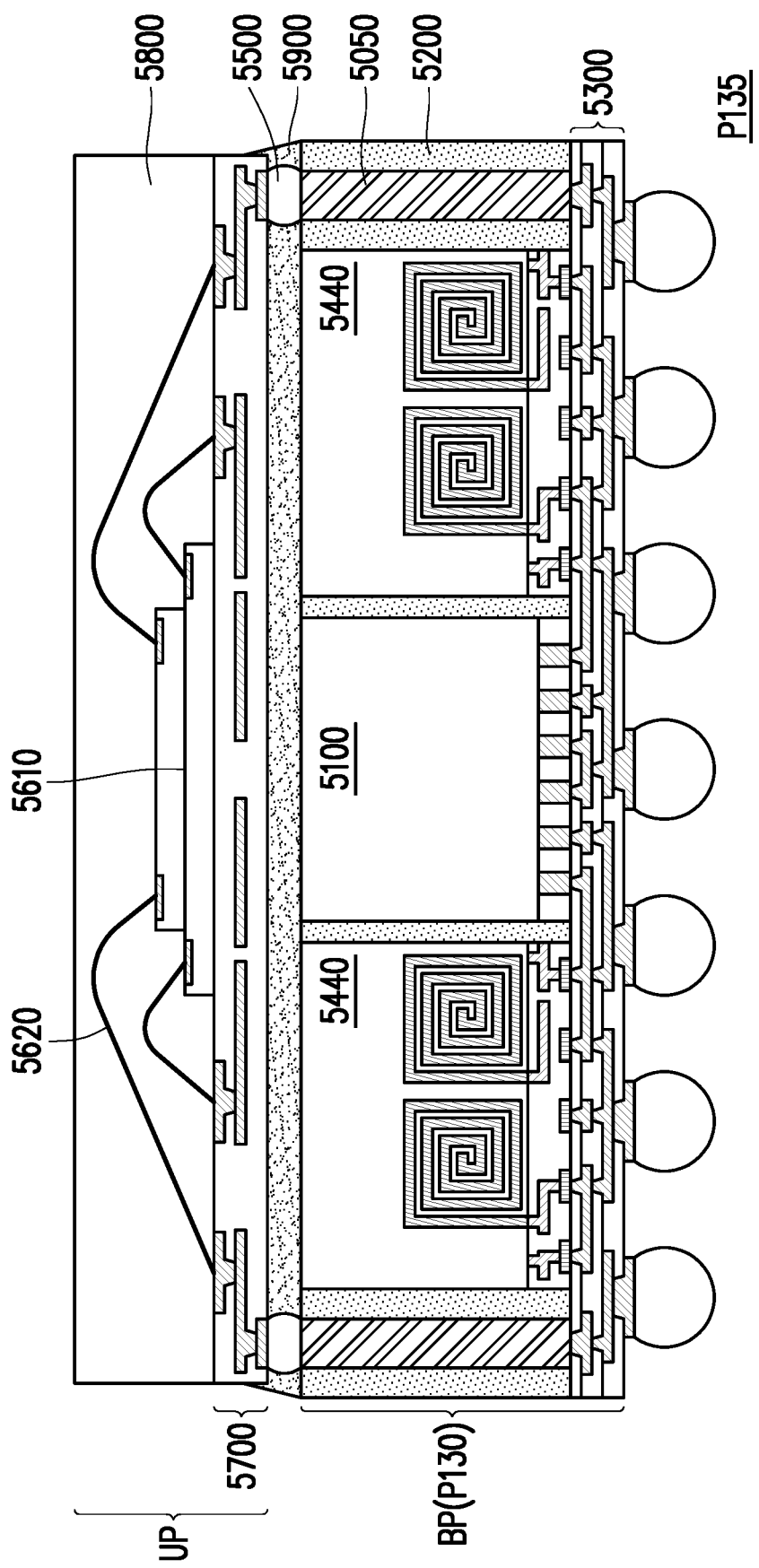
FIG. 8D is a schematic cross-sectional view illustrating a semiconductor package according to some embodiments of the disclosure.

In some embodiments, the TIVs 5050 are available to establish dual-side vertical electrical connection. For example, as illustrated in FIG. 8D, the semiconductor package P130 may be adapted to be a bottom package BP of a package-on-package structure, as in the semiconductor package P135. An upper package UP may be connected to the bottom package BP through connective terminals 5500 which contact first ends of the TIVs 5050, while the other ends are connected to the redistribution structure 5300. In some embodiments, the upper package UP may be a memory package. For example, the upper package UP may include a chip stack 5610 wire bonded through conductive wires 5620 to a redistribution layer 5700. The redistribution layer 5700 may connect the conductive wires 5620 and the chip stack 5610 to the connective terminals 5500. In some embodiments, the chip stack 5610 and the conductive wires 5620 may be encapsulated by an encapsulant 5800. An underfill 5900 may be provided between the bottom package BP and the upper package UP to protect the connective terminals 5500 from thermal and mechanical stresses, thus securing the connection within the semiconductor package P135. However, the disclosure is not limited thereto. In some embodiments, other types of packages, including different components or having different functions, may be used as the upper package UP.

Figure 9:
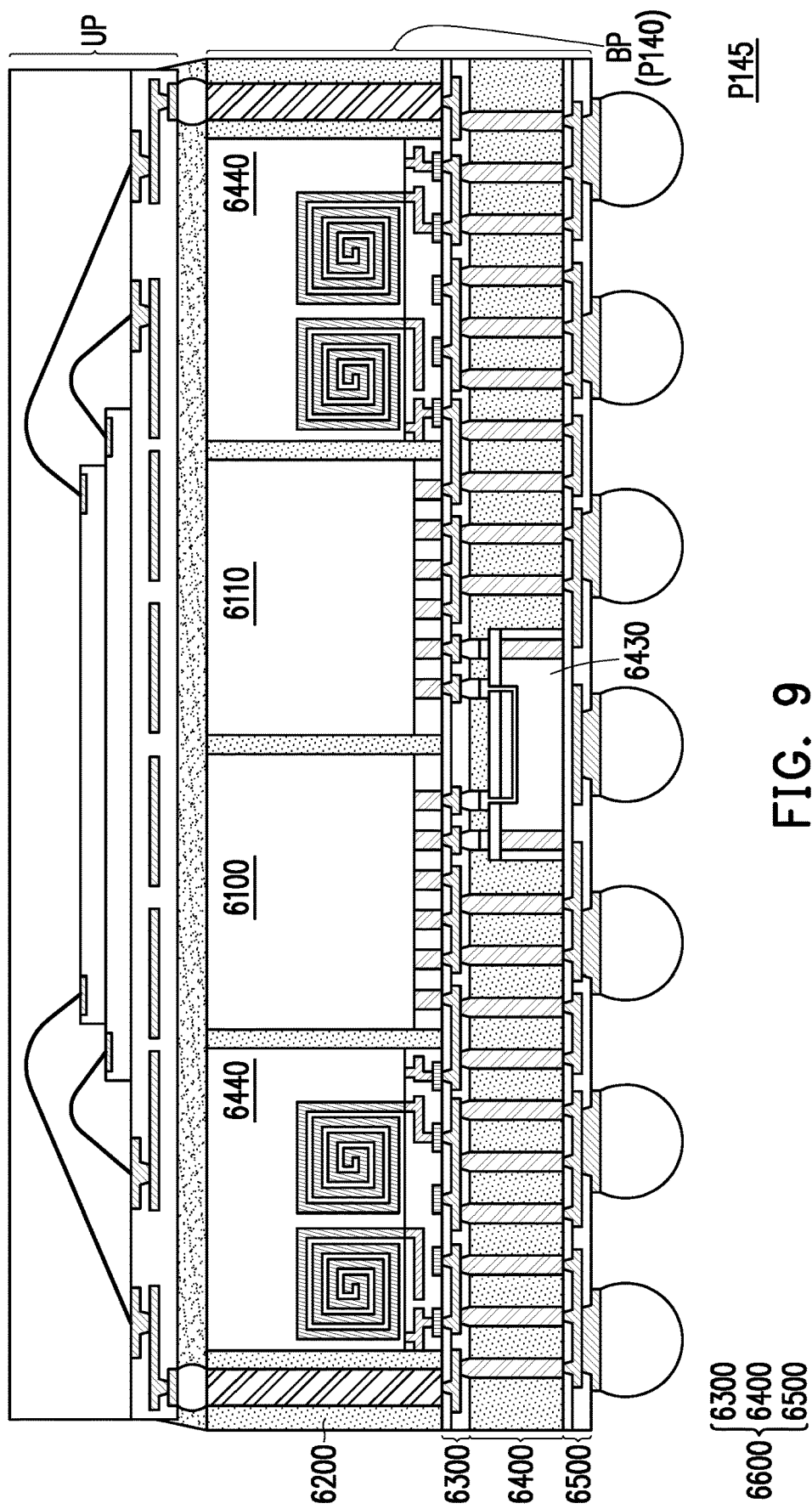
FIG. 9 is a schematic cross-sectional view illustrating a semiconductor package in accordance with some embodiments of the disclosure.

FIG. 9 is a schematic cross-sectional view of a semiconductor package P145 according to some embodiments of the disclosure. The semiconductor package P145 may be similar to the semiconductor package P135 of FIG. 8D. A difference between the semiconductor package P145 and the semiconductor package P135 of FIG. 8D lies in the use of the semiconductor package P140 as the bottom package BP. In the semiconductor package P140, the redistribution structure 6600 includes an inner redistribution layer 6300, a bridging layer 6400, and an outer redistribution layer 6500 stacked in sequence, similar to the semiconductor package P20 of FIG. 2F. However, in the semiconductor package P140, only the semiconductor bridge 6430 is embedded in the bridging layer 6400, while the integrated passive devices 6440 are embedded in the encapsulant 6200 at the sides of the semiconductor dies 6100, 6110. In some embodiments, the semiconductor bridge 6430 interconnects the semiconductor dies 6100, 6110. The inner redistribution layer 6300 may interconnect the semiconductor dies 6100, 6110 with adjacent integrated passive devices 6440. However, the disclosure is not limited thereto. In some alternative embodiments, the semiconductor bridge 6430 may also interconnect the semiconductor dies 6100, 6110 with adjacent integrated passive devices 6440.

Figure 10:
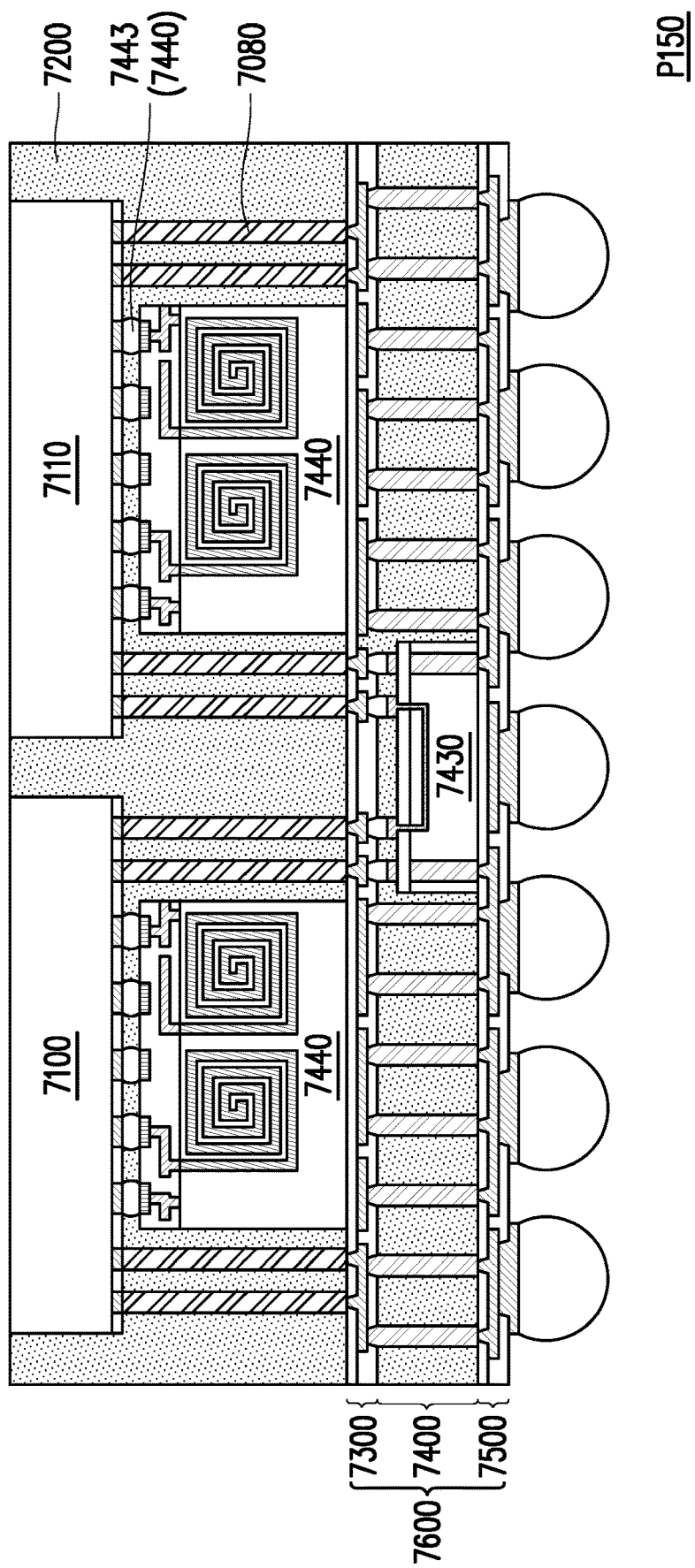
FIG. 10 is a schematic cross-sectional view illustrating a semiconductor package in accordance with some embodiments of the disclosure.

FIG. 10 is a schematic cross-sectional view of a semiconductor package P150 according to some embodiments of the disclosure. A difference between the semiconductor package P150 and the semiconductor package P140 of FIG. 9 lies in the position of the integrated passive devices 7440. That is, in the semiconductor package P150, the integrated passive devices 7440 are stacked on the semiconductor dies 7100, 7110, and are disposed in between the semiconductor dies 7100, 7110 and the inner redistribution layer 7300 of the redistribution structure 7600. In some embodiments, the integrated passive devices 7440 are bonded to the semiconductor dies 7100, 7110 in a face-to-face configuration, either directly or through intervening conductive terminals 7443. TIVs 7080 are provided on the semiconductor dies 7100, 7110 to establish connection between the semiconductor dies 7100, 7110 and the inner redistribution layer 7300. The encapsulant 7200 may embed the semiconductor dies 7100, 7110, the integrated passive devices 7440, and the TIVs 7080. Portions of the encapsulant 7200 may extend between the semiconductor dies 7100, 7110 and the inner redistribution layer 7300.

In accordance with some embodiments of the disclosure, a semiconductor package includes a first semiconductor die, a second semiconductor die, a semiconductor bridge, an integrated passive device, a first redistribution layer, and connective terminals. The second semiconductor die is disposed beside the first semiconductor die. The semiconductor bridge electrically connects the first semiconductor die with the second semiconductor die. The integrated passive device is electrically connected to the first semiconductor die. The first redistribution layer is disposed over the semiconductor bridge. The connective terminals are disposed on the first redistribution layer, on an opposite side with respect to the semiconductor bridge. The first redistribution layer is interposed between the integrated passive device and the connective terminals.

In accordance with some embodiments of the disclosure, a semiconductor package includes semiconductor dies, an encapsulant and a redistribution structure. The encapsulant encapsulates the semiconductor dies. The redistribution structure is disposed on the encapsulant and the semiconductor dies. The redistribution structure includes, in order, a first redistribution layer, a bridging layer, and a second redistribution layer. The bridging layer includes a semiconductor bridge and an integrated passive device. The semiconductor bridge interconnects at least two semiconductor dies of the semiconductor dies. The integrated passive device is electrically connected to at least one of the at least two semiconductor dies through the first redistribution layer.

In accordance with some embodiments of the disclosure, a manufacturing method of a semiconductor package includes the following steps. Semiconductor dies are provided. An encapsulant is formed encapsulating the semiconductor dies. A semiconductor bridge is provided electrically connecting at least two semiconductor dies of the semiconductor dies. An integrated passive device is provided. The integrated passive device is electrically connected to one semiconductor die of the at least two semiconductor dies. A redistribution layer is formed over the integrated passive device and the semiconductor dies.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
   a first redistribution layer;
   a semiconductor die, disposed over the first redistribution layer, and having a first surface and a second surface opposite to the first surface;
   an integrated passive die, disposed between the first surface of the semiconductor die and the first redistribution layer, and electrically connected to the semiconductor die;
   a first encapsulant, formed between first surface of the semiconductor die and the first redistribution layer, and encapsulating the integrated passive die;
   connective terminals, deployed at a surface of the first redistribution layer opposite to the first encapsulant; and
   a second redistribution layer, extending along the first surface of the semiconductor die, wherein the integrated passive die is in contact with the semiconductor die through the second redistribution layer,
   wherein a shortest distance between the integrated passive die and the semiconductor die is shorter than a shortest distance between the first redistribution layer and the semiconductor die, and wherein a front side of the integrated passive die at which micro-bumps are disposed faces toward the first surface of the semiconductor die, and a back side of the integrated passive die is in direct contact with the first redistribution layer, and wherein contact pads are disposed on the second redistribution layer and protruded from the second redistribution layer, through interconnection vias stand on a first group of the contact pads, and the integrated passive die is attached onto a second group of the contact pads via the micro-bumps.

2. The semiconductor package according to claim 1, wherein the first encapsulant is in contact with the first and second redistribution layers by opposite sides, and through interconnection vias penetrating through the first encapsulant establish conduction paths between the first and second redistribution layers.

3. The semiconductor package according to claim 1, wherein the integrated passive die comprises through semiconductor vias configured to establish conduction paths between a front side and a back side of the integrated passive die.

4. The semiconductor package according to claim 1, wherein the integrated passive die is a capacitor die.

5. The semiconductor package according to claim 1, wherein the micro-bumps include a conductive post and a solder cap disposed on the conductive post.

6. The semiconductor package according to claim 1, wherein a sidewall of the first redistribution layer, a sidewall of the first encapsulant and a sidewall of the second redistribution layer are substantially aligned with each other.

7. The semiconductor package according to claim 1, further comprising:
   a second encapsulant, disposed over the first encapsulant, and encapsulating the semiconductor die.

8. The semiconductor package according to claim 7, wherein a sidewall of the first redistribution layer, a sidewall of the first encapsulant and a sidewall of the second encapsulant are substantially aligned with each other.

9. A semiconductor package, comprising:
   a first redistribution layer;
   an integrated passive die, disposed on the first redistribution layer;
   a semiconductor die, stacked over the integrated passive die, and electrically connected to the integrated passive die;
   a first encapsulant, formed between the semiconductor die and the first redistribution layer, and encapsulating the integrated passive die;
   through interconnection vias, penetrating through the first encapsulant, and located around the integrated passive die, wherein the semiconductor die is electrically connected to the first redistribution layer via the through interconnection vias; and
   a second redistribution layer, extending under the semiconductor die, wherein the integrated passive die is in contact with the semiconductor die through the second redistribution layer,
   and wherein a shortest distance between the integrated passive die and the semiconductor die is shorter than a shortest distance between the first redistribution layer and the semiconductor die, and wherein a front side of the integrated passive die at which micro-bumps are disposed faces toward the semiconductor die, and a back side of the integrated passive die is in direct contact with the first redistribution layer, and wherein contact pads are disposed on the second redistribution layer and protruded from the second redistribution layer, the through interconnection vias stand on a first group of the contact pads, and the integrated passive die is attached onto a second group of the contact pads via the micro-bumps.

10. The semiconductor package according to claim 9, wherein the integrated passive die is vertically spaced apart from the semiconductor die.

11. The semiconductor package according to claim 9, further comprising:

connective terminals, deployed at a surface of the first redistribution layer opposite to the first encapsulant, wherein the integrated passive die and the connective terminals are disposed at opposite sides of the first redistribution layer.

12. The semiconductor package according to claim 9, wherein the semiconductor die is electrically connected to the integrated passive die and the first redistribution layer through the second redistribution layer.

13. The semiconductor package according to claim 12, wherein the integrated passive die, the first encapsulant and the through interconnection vias are located between the first and second redistribution layers.

14. The semiconductor package according to claim 12, wherein a sidewall of the first redistribution layer, a sidewall of the first encapsulant and a sidewall of the second redistribution layer are substantially aligned with each other.

15. A semiconductor package, comprising:
a first redistribution layer;
a semiconductor die, disposed over the first redistribution layer, and having a first surface and a second surface opposite to the first surface;
an integrated passive die, attached to the first surface of the semiconductor die, and located between the semiconductor die and the first redistribution layer;
a first encapsulant, encapsulating the semiconductor die and the integrated passive die;
a second redistribution layer, lying below the first redistribution layer; and
a second encapsulant, vertically separating the second redistribution layer from the first redistribution layer, wherein a shortest distance between the integrated passive die and the semiconductor die is shorter than a shortest distance between the first redistribution layer and the semiconductor die.

16. The semiconductor package according to claim 15, further comprising:
second through interconnection vias, penetrating through the second encapsulant to establish conduction paths between the first and second redistribution layers.

17. The semiconductor package according to claim 15, further comprising:
connective terminals, deployed at a surface of the second redistribution layer facing away from the second encapsulant.

18. The semiconductor package according to claim 15, wherein a sidewall of the first redistribution layer, a sidewall of the first encapsulant, a sidewall of the second redistribution layer and a sidewall of the second encapsulant are substantially aligned with each other.

19. The semiconductor package according to claim 15, further comprising:
first through interconnection vias, penetrating through the first encapsulant to establish conduction paths between the semiconductor die and the first redistribution layer.

20. The semiconductor package according to claim 19, wherein the integrated passive die and the first through interconnection vias are overlapped with the semiconductor die.

* * * * *